(12) United States Patent
Yokoyama

(10) Patent No.: US 7,973,469 B2
(45) Date of Patent: Jul. 5, 2011

(54) ORGANIC ELECTROLUMINESCENCE ELEMENT, AND ILLUMINATING DEVICE AND DISPLAY DEVICE THEREWITH

(75) Inventor: Mitsuru Yokoyama, Takatsuki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 287 days.

(21) Appl. No.: 12/298,043

(22) PCT Filed: Aug. 28, 2007

(86) PCT No.: PCT/JP2007/066613
§ 371 (c)(1),
(2), (4) Date: Oct. 22, 2008

(87) PCT Pub. No.: WO2008/032557
PCT Pub. Date: Mar. 20, 2008

(65) Prior Publication Data
US 2009/0066241 A1    Mar. 12, 2009

(30) Foreign Application Priority Data
Sep. 12, 2006 (JP) ................................. 2006-246941

(51) Int. Cl.
*H05B 33/20* (2006.01)
(52) U.S. Cl. ........................................ 313/504; 313/506
(58) Field of Classification Search .......... 313/498–512; 315/169.3; 345/36, 45, 76
See application file for complete search history.

(56) References Cited

U.S. PATENT DOCUMENTS

| 6,762,553 B1 | 7/2004 | Yokogawa et al. | 313/509 |
| 2002/0160296 A1 * | 10/2002 | Wolk et al. | 430/200 |
| 2003/0057417 A1 * | 3/2003 | Lee et al. | 257/40 |
| 2004/0209007 A1 * | 10/2004 | Satake et al. | 428/1.3 |
| 2004/0240777 A1 * | 12/2004 | Woodgate et al. | 385/16 |

FOREIGN PATENT DOCUMENTS

| JP | 62-172691 A | 7/1987 |
| JP | 01-220394 A | 9/1989 |
| JP | 63-314795 A | 12/1998 |
| JP | 11-283751 A | 10/1999 |
| JP | 2001-202827 A | 7/2001 |
| JP | 2006-237306 A | 9/2006 |
| WO | WO 2006/092964 A1 | 9/2006 |
| WO | WO 2008/032557 A1 | 3/2008 |

* cited by examiner

*Primary Examiner* — Nimeshkumar D Patel
*Assistant Examiner* — Christopher M Raabe
(74) *Attorney, Agent, or Firm* — Sidley Austin LLP

(57) ABSTRACT

In an organic EL element, at the interface between a first electrode and a light-emitting layer, a diffraction grating with grating constants a, b, and c is provided in the form of surface irregularities on the first electrode. The grating constants are determined such that, when the effective refractive index as light experiences in the organic EL element is n, with respect to the periods $d_{01}$, $d_{10}$, and $d_{1-1}$ defining the periodicity of the diffraction grating, $n \times d_{01}$ corresponds to a red region and $n \times d_{10}$ and $n \times d_{1-1}$ correspond to a blue to green region.

17 Claims, 11 Drawing Sheets

ORGANIC ELECTROLUMINESCENCE ELEMENT, AND ILLUMINATING DEVICE AND DISPLAY DEVICE THEREWITH

RELATED APPLICATIONS

This application is a National Stage of International Application No. PCT/JP2007/066613, filed Aug. 28, 2007, which is based on Japanese Patent Application No. 2006-246941, the entire contents of which is incorporated herein by reference.

TECHNICAL FIELD

The present invention relates to organic electroluminescence elements that emit white light, and to illuminating devices and display devices provided with such organic electroluminescence elements.

BACKGROUND ART

A kind of light-emitting element, organic electroluminescence elements (henceforth "organic EL elements") can be made to emit light in desired colors by appropriate choice of light-emitting materials. By proper combination of light-emitting materials, it is possible even to obtain white light, and thus organic EL elements are expected to find uses as backlights, i.e. light-emitting devices, in liquid crystal display devices and, for their low power consumption combined with high luminance, as illuminating light sources to supplant fluorescent and tungsten lamps.

When used as a backlight in a liquid crystal display device, an organic EL element is arranged on the back of a liquid crystal panel, and image display is achieved as a result of the light emitted from the organic EL element being modulated by the liquid crystal layer of the liquid crystal panel. Other than organic EL elements, widely used as backlights are light-emitting diodes (henceforth "LEDs") and cathode lamps. Since LEDs are point light sources and cathode lamps are line light sources, however, the light emitted from them needs to be guided, by use of a light guide plate, to the back of a liquid crystal panel. This leads to disadvantages such as large device thickness and uneven brightness. By contrast, since organic EL elements are plane light sources, they do not require a light guide plate, and radiate uniform light with even brightness.

Now, with reference to FIG. 20, the structure of a common organic EL element will be described. An organic EL element 110 has a first electrode 112, a light-emitting layer 114, and a second electrode 115 provided in this order on a transparent substrate 111 formed of glass or the like. The first electrode 112 is a film of ITO (indium tin oxide) or IZO (indium zinc oxide) formed by sputtering or the like on the transparent substrate 111, and is transparent. The light-emitting layer 114 is a film of an organic light-emitting material formed on the first electrode 112. The second electrode 115 is a film of a metal formed by vacuum deposition or the like on the light-emitting layer 114.

When a voltage is applied between the first electrode 112 and the second electrode 115, light emission occurs in the light-emitting layer 114 as a result of recombination of holes injected from the first electrode 112, functioning as an anode, and electrons injected from the second electrode 115, functioning as a cathode. The light is transmitted through the first electrode 112 and the transparent substrate 111, so that to an observer the organic EL element 110 appears to emit light. By controlling the dopant added to the light-emitting layer 114, the wavelength of the light emitted can be varied.

To obtain white light from the organic EL element 110, light of two wavelengths is mixed by some methods (two-wavelength type), and light of three wavelengths is mixed by other methods (three-wavelength type).

Examples of Two-Wavelength Type Methods Include:
1. a method according to which the light-emitting layer 114 is made to emit blue light and also orange light, i.e. the color complementary to blue (EL+EL);
2. a method according to which, in the vicinity of the light-emitting layer 114, provided as a single layer and emitting blue light, a fluorescent or phosphorescent member is placed that by absorbing the blue light fluoresces or phosphoresces in orange (EL+PL).

When the EL+EL method noted at 1. above is adopted, separate layers may be provided to emit light of different colors, or alternatively a single layer may be doped with dopants for different colors so that white light is emitted as a result of mixture of light of two colors. Here, EL is short for electroluminescence and PL is short for photoluminescence.

Examples of Three-Wavelength Type Methods Include:
1. a method according to which the light-emitting layer 114 is made to emit blue, green, and red light (EL+EL+EL);
2. a method according to which, in the vicinity of the light-emitting layer 114, provided as a single layer and emitting blue light, a fluorescent or phosphorescent member is placed that by absorbing the blue light fluoresces or phosphoresces in green and red (EL+PL+PL); and
3. a method according to which, in the vicinity of the light-emitting layer 114, provided as a single layer and emitting ultraviolet rays, a fluorescent or phosphorescent member is placed that by absorbing the ultraviolet rays fluoresces or phosphoresces in blue, green, and red (EL+PL+PL+PL).

When the EL+EL+EL method noted at 1. above is adopted, separate layers may be provided to emit light of different colors, or alternatively a single layer may be doped with dopants for different colors so that white light is emitted as a result of mixture of light of three colors.

For enhanced color rendering, for example, a four-wavelength type method is possible that uses, in addition to blue, green, and red light, cyan (blue-green) light.

In general, depending on the dopant added to it, the light-emitting layer 114 may fluoresce or phosphoresce. In the current state of the art, fluorescence and phosphorescence in different colors exhibit tendencies as shown in Table 1 in terms of light emission efficiency and light emission lifetime. In Table 1, "Good" denotes a level inferior to "Excellent" or "Good" but still not unacceptable in practical terms.

TABLE 1

| Type | Color | Efficiency | Lifetime |
| --- | --- | --- | --- |
| Fluorescence | Blue | Fair | Fair |
| | Green | Fair | Excellent |
| | Red | Poor | Poor |
| Phosphorescence | Blue | Good | Unacceptable |
| | Green | Excellent | Good |
| | Red | Good | Excellent |

As will be understood from Table 1, both fluorescence and phosphorescence in green are on the whole superior to those in other colors in terms of light emission efficiency and light emission lifetime; however, fluorescence in blue is inferior to that in green in terms of light emission lifetime, and so is fluorescence in red in terms of light emission efficiency and light emission lifetime; phosphorescence in blue has a far shorter lifetime than that in other colors.

In an organic EL element, the light emission luminance is approximately proportional to the current density; thus the light emission luminance can be increased by increasing the applied voltage, thereby increasing the injected current, and thereby increasing the current density. On the other hand, since the light emission lifetime deteriorates in inverse proportion to the current density raised to the power of 1.5 to 2, there is demand for efficient use of the emitted light with the current density, and hence the applied voltage, lowered as much as possible.

In general, a backlight for a liquid crystal display device needs to have a front luminance of about 2 000 to 4 000 cd/m$^2$. Inconveniently, however, in an organic EL element as a white light source, uneven light emission efficiency and uneven light emission lifetime among different colors as described above lead to, when the current density is so set as to promise a satisfactory light emission lifetime, a front luminance as low as about 1 000 to 1 500 cd/m$^2$.

Inconveniently, with organic EL elements with a layer structure like that of the organic EL element 110 shown in FIG. 20, the proportion of, of the light generated in the transparent substrate 111, the part that manages to come out through the transparent substrate 111—the proportion called light extraction efficiency—is extremely small, being about 15 to 20%. This is believed to be due to the following facts: the light that is incident on the interface between the transparent substrate 111 and air—the interface called the observation surface—at incidence angles equal to or larger than the critical angle is totally reflected, and thus cannot come out through the observation surface of the transparent substrate 111; likewise, also at the interface between the transparent substrate 111 and the first electrode 112 and at the interface between the first electrode 112 and the light-emitting layer 114, the light incident at large incidence angles is totally reflected and thereby guided inside the first electrode 112 and the light-emitting layer 114, thus unable to come out through the observation surface of the transparent substrate 111 but escaping to the side of the organic EL element 110.

As one way to enhance the light extraction efficiency, Patent Document 1 listed below proposes a method according to which the light exit surface of the transparent substrate is formed in the shape of a large number of convex lenses so that the transparent substrate has a light-condensing ability; Patent Document 2 listed below proposes a method according to which a mirror is provided on the side of the light-emitting layer opposite from its light extraction side. Inconveniently, in the small element it is difficult to form the shape of convex lenses, and with the thin light-emitting layer it is difficult to shape it into a taper to form a mirror. As yet another way, Patent Document 3 listed below proposes a method according to which, in an organic EL element having a transparent electrode, a first dielectric layer, a light-emitting layer, a second dielectric layer, and a back electrode laid in this order on a transparent, between the transparent electrode and the first dielectric layer, a third dielectric layer is provided that has a refractive index intermediate between theirs. This improves the transmittance with which light comes out, but does not prevent total reflection.

To overcome these inconveniences, Patent Document 4 listed below proposes a method according to which, in the organic EL element mentioned above, a diffraction grating is formed at the interface between the transparent substrate and the first electrode, or at the interface between the first electrode and the light-emitting layer, so that the diffraction grating makes equal to or smaller than the critical angle the emergence angles of the light incident at incidence angles equal to or larger than the critical angle. This enhances the light extraction efficiency.

On the other hand, Patent Document 5 listed below proposes a method according to which, in an organic EL element having a light-emitting layer, a electrically conductive transparent film, and a glass plate provided in this order on a back metal electrode, between the electrically conductive transparent film and the glass plate, a low-refraction member is provided. This enhances the rate of light extraction from the low-refraction member and the glass plate.

Patent Document 1: JP-A-S63-314795 (page 2, FIG. 1)
Patent Document 2: JP-A-H1-220394 (pages 2 and 3, FIG. 1)
Patent Document 3: JP-A-S62-172691 (pages 2 and 3, FIG. 1)
Patent Document 4: JP-A-H11-283751 (pages 3 and 4, FIG. 2)
Patent Document 5: JP-A-2001-202827 (pages 2-5, FIG. 3)

DISCLOSURE OF THE INVENTION

Problems to be Solved by the Invention

To satisfactorily benefit from the organic EL element proposed in Patent Document 5, it is necessary to make sufficiently smaller than the wavelength of light the total layer thickness of an organic layer—with so high a refractive index as to confine light easily by total reflection at the interfaces—and the transparent electrode layer. This leads to the disadvantage of less flexibility in design of the organic layer.

On the other hand, the diffraction grating used in the organic EL element proposed in Patent Document 4 only diffracts light in a particular wavelength range determined by the shape and grating constant of the grating. Thus, when it is used in an organic EL element as a white light source that emits light in a wide wavelength range simultaneously, the light extraction efficiency is markedly higher at particular wavelengths than elsewhere, possibly leading to an improper color balance and hence degraded quality of white.

As mentioned previously, organic EL elements as white light sources are classified into two-wavelength and three-wavelength types. When consideration is given to the color rendering desired when they are used as backlights in liquid crystal displays, it is preferable to produce white light by mixing light of at least three colors, namely red, green, and blue.

Now a description will be given of a case in which, in an organic EL element that emits whit light with a light emission spectrum as shown in FIG. 3, a one-dimensional diffractive grating is provided so that the light extraction efficiency is enhanced at a plurality of wavelengths by diffraction. In the spectrum shown in FIG. 3, the light emission intensity has maxima in the vicinity of 630 nm (red), 520 nm (green), 475 nm (cyan), and 450 nm (blue). Accordingly, to enhance the light extraction efficiency at the wavelengths corresponding to all those maxima so that diffraction may not degrade the quality of white, in a case where the effective refractive index as the light generated in the light-emitting layer experiences in the organic EL element is 1.7, it is possible to use, for example:

(1) with a grating constant d=4.08 μm, diffraction of orders 11, 13, 14, and 15;
(2) with a grating constant d=7.78 μm, diffraction of orders 21, 25, 28, and 29; or
(3) with a grating constant d=21.86 μm, diffraction of orders 59, 71, 77, and 83.

By the diffraction here, light that is totally reflected at any of the interfaces between the layers composing the element and that thus cannot be extracted out of the element is, with a periodic refractive-index structure, diffracted into the direction perpendicular to the substrate. In this case, the wavelengths corresponding to the different orders in the different examples are, in the order mentioned, as follows:

(1) 630 nm, 533 nm, 495 nm, and 462 nm;
(2) 630 nm, 529 nm, 473 nm, and 456 nm; or
(3) 630 nm, 524 nm, 483 nm, and 448 nm.

This Method, However, has the Following Disadvantages:

1. since diffraction of considerably high orders is used, high diffraction efficiency is not expected; in addition, diffraction of lower orders produces much unwanted diffracted light, resulting in low light extraction efficiency;

2. since the grating is one-dimensional, as the direction of travel of light deviates from the direction of refractive index modulation (as it deviates from the direction perpendicular to the grating), the diffracted wavelengths deviate, and the diffraction efficiency lowers; in addition, when the direction of travel of light becomes perpendicular to the direction of refractive index modulation (when it becomes parallel to the grating), no diffraction occurs any longer.

It is therefore an object of the present invention to provide a white organic EL element that produces high-luminance, high-quality white light as a result of its being provided with a two-dimensional diffraction grating that strongly acts on light of three or more colors in the visible light region, and to provide a display device and an illuminating device provided with such an organic EL element.

Means for Solving the Problem

To achieve the above object, according to one aspect of the present invention, an organic electroluminescence element emitting white light comprises: a substrate; a first electrode formed on the substrate; a light-emitting layer formed on the first electrode; and a second electrode formed on the light-emitting layer. Here, a refractive index distribution having two-dimensional translational symmetry is provided at one or more of the following locations: near the first electrode inside the substrate; at the interface between the substrate and the first electrode; at the interface between the first electrode and the light-emitting layer; and at the interface between the light-emitting layer and the second electrode. Thus light of three or more wavelengths in the visible light region contained in the white light generated in the light-emitting layer is diffracted by the periodicity of the refractive index distribution.

According to another aspect of the present invention, an organic electroluminescence element emitting white light comprises: a substrate; a first electrode formed on the substrate; a light-emitting layer formed on the first electrode; and a second electrode formed on the light-emitting layer. Here, a refractive index distribution having two-dimensional translational symmetry is provided at one or more of the following locations: near the first electrode inside the substrate; and at an interface between layers between the substrate and the second electrode. Thus light of three or more wavelengths in the visible light region contained in the white light generated in the light-emitting layer is diffracted by the periodicity of the refractive index distribution.

According to yet another aspect of the present invention, an organic electroluminescence element emitting white light comprises: a substrate; a first electrode formed on the substrate; a light-emitting layer formed on the first electrode; and a second electrode formed on the light-emitting layer. Here, a refractive index distribution having two-dimensional translational symmetry is provided between the substrate and the second electrode. Thus light of three or more wavelengths in the visible light region contained in the white light generated in the light-emitting layer is diffracted by the periodicity of the refractive index distribution.

Advantages of the Invention

According to the present invention, in an organic electroluminescence element emitting white light, by the periodicity of a refractive index distribution having two-dimensional translational symmetry provided inside it, out of the light generated in a light-emitting layer and incident on interfaces at incidence angles equal to or more than the critical angle, light of three or more wavelengths in the visible light region is diffracted. This helps obtain increased luminance without degrading the quality of white light.

Moreover, according to the present invention, by use of the organic electroluminescence element structured as described above, it is possible to realize a high-luminance, long-life illuminating device. Moreover, by use of a liquid crystal panel and the organic electroluminescence element structured as described above, it is possible to realize a display device provided with a high-luminance, long-life backlight.

In this illuminating device or display device, by providing on the surface of the organic electroluminescence element facing the liquid crystal panel at least one of a birefringent sheet and a light-diffusive sheet, or by using as the transparent substrate of the organic electroluminescence element one having at least one of birefringence and light diffusivity, it is possible to avoid breaking the white balance even when the light from the organic electroluminescence element is polarized by the liquid crystal panel, and thus it is possible to make the image displayed on the display device sharp.

LIST OF REFERENCE SYMBOLS

Figure 1:
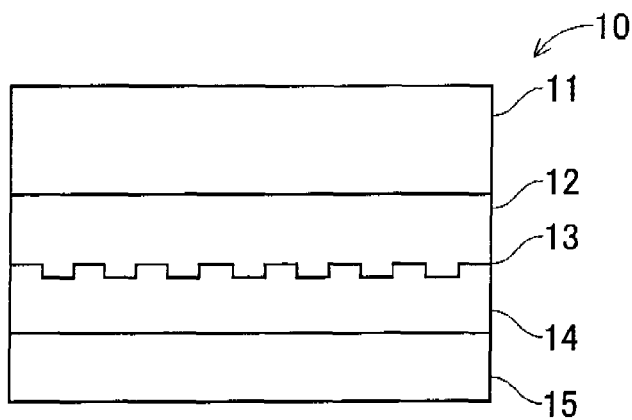
FIG. 1 An outline structure diagram of an organic EL element according to a first embodiment of the invention.

10 Organic EL element
11 Transparent substrate
12 First electrode
13 Diffraction grating
14 Light-emitting layer
15 Second electrode
20 Liquid crystal display device
21 Liquid crystal panel
22 Backlight
40 Illuminating device
41 Frame

BEST MODE FOR CARRYING OUT THE INVENTION

First Embodiment

Figure 2:
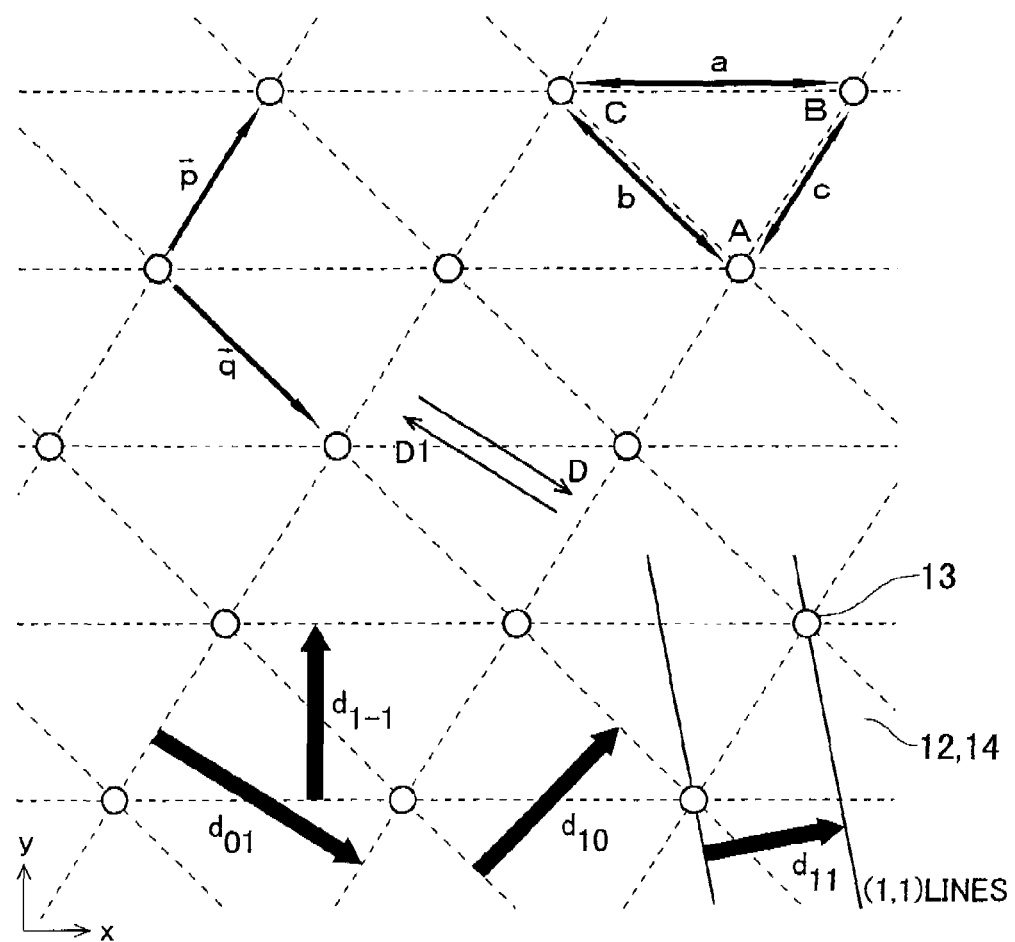
FIG. 2 An enlarged partial plan view of a diffraction grating having an oblique lattice according to the first embodiment of the invention.

A first embodiment of the present invention will be described below with reference to the drawings. FIG. 1 is an outline structure diagram of an organic EL element according to the first embodiment, and FIG. 2 is an enlarged partial plan view of a diffraction grating.

First, the structure of the organic EL element 10 will be described. As shown in FIG. 1, the organic EL element 10 has a first electrode 12, a diffraction grating 13, a light-emitting layer 14, and a second electrode 15 provided in this order on a transparent substrate 11.

As the transparent substrate 11, any transparent material such as glass or resin may be used. There is no particular limitation on the kind, such as glass or plastic, of the material, examples of preferably used materials including glass, quartz, and transparent resin film. Particularly preferable is resin film that can make the organic EL element 10 flexible. The surface of the resin film may be coated with a film of an organic or inorganic material, or with a hybrid film of both. The resin film is, preferably, a barrier film with a water vapor transmission rate of 0.01 g/m²·day·atm or less and, more preferably, a high-barrier film with an oxygen transmission rate of $10^{-3}$ g/m²/day or less and a water vapor transmission rate of $10^{-5}$ g/m²/day.

The material of the barrier film may be any material that can suppress entry of substances, such as moisture and oxygen, that degrade the element, examples of preferably used materials including silicon oxide, silicon dioxide, and silicon nitride. To improve the fragility of the film, more preferably, these layers of inorganic and organic materials are laid on one another. There is no particular limitation on the order in which inorganic and organic are laid; preferably, they are laid alternately a plurality of times.

There is no particular limitation on the method by which the barrier film is formed, examples of preferably used methods including vacuum deposition, sputtering, reactive sputtering, molecular beam epitaxy, cluster-ion beaming, ion plating, plasma polymerization, atmospheric pressure plasma polymerization, plasma CVD, laser CVD, thermal CVD, and coating. Particularly preferable is atmospheric pressure plasma polymerization as disclosed in JP-A-2004-68143.

As the first electrode 12, which functions as the anode, preferably used is one using as an electrode substance a metal, alloy, electrically conductive compound, or mixture of these, with a high work function (4 eV or more). Specific examples of such electrode substances include metals such as Au, and electrically conductive transparent materials such as CuI, ITO (indium tin oxide), $SnO_2$, and ZnO. To form the first electrode 12, a thin film of such an electrode material is formed on the transparent substrate 11 by a method such as vacuum deposition or sputtering, and the film is then patterned into a desired shape by a method such as photolithography. In a case where the emitted light is extracted from the first electrode 12, it is preferable that the transmittance be 10% or more, and it is preferable that the sheet resistance as the anode be several hundred Ω/□ or less. Though depending on the material, the film thickness is set typically in the range from 10 to 1 000 nm, and preferably in the range from 10 to 200 nm. At the interface between the first electrode 12 and the light-emitting layer 14, the diffraction grating 13 is formed.

As the second electrode 15, which functions as the cathode, preferably used is one using as an electrode substance a metal (called electron-injective metal), alloy, electrically conductive compound, or mixture of these, with a low work function (4 eV or less). Specific examples of such electrode substances include sodium, a sodium-potassium alloy, magnesium, lithium, a magnesium-copper mixture, a magnesium-silver mixture, a magnesium-aluminum mixture, a magnesium-indium mixture, an aluminum-aluminum oxide ($Al_2O_3$) mixture, indium, a lithium-aluminum mixture, and rare-earth metals. To form the second electrode 15, a thin film of such an electrode substance is formed by a method such as vacuum deposition or sputtering. It is preferable that the sheet resistance as the cathode be several hundred Ω/□ or less, and the film thickness is set typically in the range from 10 nm to 5 μm, and preferably in the range from 50 to 200 nm.

The light-emitting layer 14 is the layer where electrons and holes injected from the first electrode 12, the second electrode 15, and the later-described electron transport layer and hole transport layer recombine to produce phosphorescence or fluorescence, and the light emission may take place inside the light-emitting layer 14 or at the interface between the light-emitting layer 14 and the adjacent layer.

In recent years, since Princeton University reported organic EL elements exploiting phosphorescence from an excited triplet (M. A. Baldo et al., Nature, vol. 395, pp. 151-154 (1998)), materials exhibiting phosphorescence at room temperature have been actively studied (e.g. M. A. Baldo et al., Nature, vol. 403, issue 17, pp. 750-753 (2000); U.S. Pat. No. 6,097,147; etc.). Using an excited triplet raises the upper limit of internal quantum efficiency to 100%; in terms of principle, this increases light emission efficiency up to fourfold, bringing about a remarkable enhancement in light emission efficiency.

At the 10th International Workshop on Inorganic and Organic Electroluminescence (EL' 00, Hamamatsu), several reports were made on phosphorescent compounds. For example, Ikai et al. reported use of hole transporting compounds as a host to phosphorescent compounds. Moreover, M. E. Thompson et al. reported use of various electron transporting materials as a host to phosphorescent compounds, with those materials doped with novel iridium complexes. Furthermore, Tsutsui et al. reported high light emission efficiency achieved by introduction of a hole block layer.

Host compounds to phosphorescent compounds are dealt with in detail in, for example, C. Adachi et al., Appl. Phys. Lett., Vol. 77, p. 904 (2000).

In elements comprising a light-emitting layer containing phosphorescent compounds both as a host compound and as a dopant compound, the commonest examples of carbazole derivatives applied as the host compound are 4,4'-N,N'-dicarbazole-biphenyl(CBP) and the like. Other carbazole derivatives than CBP include the polymer types disclosed in JP-A-2001-257076 and JP-A-2002-105445 and, in particular, those with particular structures disclosed in JP-A-2001-313179, JP-A-2002-75645, etc.

A problem with these conventional compounds is what structure to adopt to obtain satisfactory light emission luminance combined with satisfactory durability. What is particularly problematic is that light emission at shorter wavelengths than green is less efficient that that at longer wavelengths than green.

It is preferable that the light-emitting layer 14 of the organic EL element 10 according to the present invention contain a host compound and a phosphorescent compound (also called phosphorescence producing compound) selected from those mentioned below.

Specific examples of widely known host compounds include those disclosed in JP-A-2001-257076, JP-A-2002-308855, JP-A-2001-313179, JP-A-2002-319491, JP-A-2001-357977, JP-A-2002-334786, JP-A-2002-8860, JP-A-2002-334787, JP-A-2002-15871, JP-A-2002-334788, JP-A-2002-43056, JP-A-2002-334789, JP-A-2002-75645, JP-A-2002-338579, JP-A-2002-105445, JP-A-2002-343568, JP-A-2002-141173, JP-A-2002-352957, JP-A-2002-203683, JP-A-2002-363227, JP-A-2002-231453, JP-A-2003-3165, JP-A-2002-234888, JP-A-2003-27048, JP-A-2002-255934, JP-A-2002-260861, JP-A-2002-280183, JP-A-2002-299060, JP-A-2002-302516, JP-A-2002-305083, JP-A-2002-305084, JP-A-2002-308837, etc.

As a phosphorescent compound, any appropriately selected from well-known ones used in a light-emitting layer in organic EL elements may be used. Preferable are complex compounds containing a group 8, 9, or 10 metal in the periodic tables of the elements, and more preferable are iridium compounds, osmium compounds, platinum compounds (platinum complex compounds), and rare earth element complexes, particularly preferable being iridium compounds.

To form the light-emitting layer 14, a film of such a compound as mentioned above is formed by a well-known thin film formation method, for example vacuum deposition, spin coating, casting, the LB process, ink-jet printing, etc.

According to the present invention, the light-emitting layer 14 comprises at least three layers producing light emission spectra with the maximum light emission wavelengths in the ranges from 430 to 480 nm, from 490 to 540 nm, and from 600 to 640 nm respectively. Henceforth the layer with the maximum light emission wavelength in the range from 430 to 480 nm will be called the blue/cyan light-emitting layer, the layer with the maximum light emission wavelength in the range from 490 to 540 nm will be called the green light-emitting layer, and the layer with the maximum light emission wavelength in the range from 600 to 640 nm will be called the red light-emitting layer. There is no particular limitation on the order in which these light-emitting layers are laid; an intermediate non-light-emitting layer may be provided between adjacent light-emitting layers. According to the present invention, it is preferable that at least one blue/cyan light-emitting layer be provided in the position closest, among all the light-emitting layers, to the first electrode 12.

There is no particular limitation on the total film thickness of the light-emitting layer 14, the thickness being set typically in the range from 2 nm to 5 μm, and preferably in the range from 2 to 200 nm. A more preferable range in the present invention is from 10 to 20 nm.

The film thickness of each light-emitting layer is set preferably in the range from 2 to 100 nm, and more preferably in the range from 2 to 20 nm. There is no particular limitation on the relationship among the film thicknesses of the blue/cyan, green, and red light-emitting layers; it is however preferable that, of the three light-emitting layers, the blue/cyan light-emitting layer (if comprising a plurality of layers, as a whole) is the thickest.

An example of sealing means used in the present invention is to bond together a sealing member (unillustrated), the transparent substrate 11, the first electrode 12, and the second electrode with adhesive. The sealing member has simply to be arranged to cover the display region of the organic EL element 10, and may be in the shape of a concave plate or flat plate; whether or not it is transparent or electrically insulating does not matter. Specific examples of the sealing member include a glass plate, a polymer plate or film, a metal plate or film, etc.

Examples of the structure of the organic EL element 10 according to the present invention include, other than the one described above, a structure comprising an anode/a light-emitting layer unit/an electron transport layer/a cathode; a structure comprising an anode/a hole transport layer/a light-emitting layer unit/an electron transport layer/a cathode; a structure comprising an anode/a hole transport layer/a light-emitting layer unit/a hole block layer/an electron transport layer/a cathode; a structure comprising an anode/a hole transport layer/a light-emitting layer unit/a hole block layer/an electron transport layer/a cathode buffer layer/a cathode; a structure comprising an anode/an anode buffer layer/a hole transport layer/a light-emitting layer unit/a hole block layer/ an electron transport layer/a cathode buffer layer/a cathode; etc. It should however be understood that the present invention is not limited to these structures. There may additionally be provided any other layer such as a hole injection layer, an intermediate layer, an electron transport layer, an electron injection layer, etc.

Now, the injection layers, block layer, electron transport layer, etc. that may be used among the layers constituting the organic EL element according to the present invention will be described.

An injection layer is a layer provided, as necessary, between an electrode and an organic layer to reduce the driving voltage and to enhance light emission luminance. There are two kinds of injection layer, namely an electron injection layer (cathode buffer layer) and a hole injection layer (anode buffer layer); as described above, the latter may be provided between the anode and the light-emitting layer or a hole transport layer, and the former between the cathode and the light-emitting layer or an electron transport layer.

Examples of the anode buffer layer (hole injection layer) include a phthalocyanine buffer layer as exemplified by copper phthalocyanine, an oxide buffer layer as exemplified by vanadium oxide, an amorphous carbon buffer layer, a polymer buffer layer using an electrically conductive polymer such as polyaniline (emeraldine) or polythiophene, etc.

Examples of the cathode buffer layer (electron injection layer) include a metal buffer layer as exemplified by strontium, aluminum, and the like, an alkali metal compound buffer layer as exemplified by lithium fluoride, an alkaline-earth metal compound buffer layer as exemplified by magnesium fluoride, an oxide buffer layer as exemplified by aluminum oxide, etc. It is preferable that these buffer layers (injection layers) be extremely thin, a preferable range of their film thickness, through depending on the material, being from 0.1 nm to 5 µm.

As described above, the hole block layer is provided, as necessary, in addition to the basic layers constituting the organic compound thin films. In a broader sense, the hole block layer functions as an electron transport layer; it is formed of a hole blocking material capable of transporting electrons but scarcely capable of transporting holes; it, by transporting electrons while blocking holes, increases the probability of recombination of electrons with holes. Alternatively, a structure of the later-described electron transport layer may be used, as necessary, as the hole block layer according to the present invention.

The hole transport layer is formed of a hole transporting material capable of transporting holes; in a broader sense, the hole transport layer includes a hole injection layer and an electron block layer. The hole transport layer may be provided in a single layer or in a plurality of layers. The hole transporting material may be any capable of injecting or transporting holes, or capable of blocking electrons, and may be organic or inorganic. Preferable examples include porphyrin compounds, aromatic tertiary amine compounds, and styrylamine compounds, particularly preferable being aromatic tertiary amine compounds.

To form the hole transport layer, a thin film of a hole transporting material as mentioned above is formed by a well-know method such as vacuum deposition, spin coating, casting, printing including ink-jet printing, the LB process, etc. There is no particular limitation on the film thickness of the hole transport layer, the thickness being set typically in the range from about 5 nm to 5 µm, and preferably in the range from 5 to 200 nm. The hole transport layer may be formed in a single layer formed of one, two, or more of the kinds of material mentioned above.

The electron transport layer is formed of a material capable of transporting electrons; in a broader sense, the electron transport layer includes an electron injection layer and a hole block layer. The electron transport layer may be formed in a single layer or in a plurality of layers.

The electron transporting material (simultaneously serving as a hole blocking material) used in the electron transport layer adjacent to the light-emitting layer on its cathode side may be any capable of transporting the electrons injected from the cathode to the light-emitting layer, examples of usable materials including nitro-substituted fluorene derivatives, diphenylquinone derivatives, thiopyranedioxide derivatives, carbodiimide, fluorenylidenemethane derivatives, anthraquinodimethane and anthrone derivatives, oxadiazole derivatives, thiadiazole derivatives, quinoxisaline derivatives, etc. Also usable are polymer materials having such a material introduced in a polymer chain, or using such a material as the principal chain of polymer. Also usable as the electron transporting material are metal complexes of 8-quinolinol derivatives such as tris(8-quinolinol)aluminum (Alq), tris(5,7-dichloro-8-quinolinol)aluminum, tris(5,7-di-bromo-8-quinolinol)aluminum, tris(2-methyl-8-quinolinol) aluminum, tris(5-methyl-8-quinolinol)aluminum, bis(8-quinolinol)zinc(Znq); and metal complexes having the central metal of these metal complexes replaced with In, Mg, Cu, Ca, Sn, Ga, or Pb.

To form the electron transport layer, a thin film of an electron transporting material as mentioned above is formed by a well-known method such as vacuum deposition, spin coating, casting, printing including ink-jet printing, the LB process, etc. There is no particular limitation on the film thickness of the electron transport layer, the thickness being set typically in the range from about 5 nm to 5 µm, and preferably in the range from 5 to 200 nm. The electron transport layer may be formed in a single layer formed of one, two, or more of the kinds of material mentioned above.

Although the organic EL element shown in FIG. 1 is of the bottom-emission type that emits light from the transparent substrate 11 side, it may instead be of the top mission type that has a metal anode, a light-emitting layer, and a transparent cathode provided in this order on a transparent or opaque substrate and that emits light from the cathode—transparent—side.

In the organic EL element 10, when a voltage is applied between the first electrode 12 and the second electrode 15, holes injected from the first electrode 12 and electrons injected from the second electrode 15 recombine to emit light.

In a case where the transparent substrate 11 is formed of glass with a refractive index of about 1.5, the first electrode 12 is formed of ITO with a refractive index of about 2.0, and the light-emitting layer 14 is formed of an organic material with a refractive index of about 1.9, the effective refractive index n as the light generated in the light-emitting layer 14 experiences in the organic EL element 10 is about 1.7. Accordingly, when this refractive index is 1.7, the effective wavelength $\lambda a$ of the light generated in the light-emitting layer 14 as observed in the organic EL element 10 and the wavelength $\lambda b$ of the light as observed in the air has the relationship $\lambda a=\lambda b/n=\lambda b/1.7$. Here, effective wavelength denotes the wavelength of light as observed inside a propagation medium, specifically inside the transparent substrate 11, the first electrode 12, and the light-emitting layer 14 of the organic EL element 10. On the other hand, the effective refractive index n varies depending on the materials of which those different parts are formed, and the value 1.7 used here is merely an example. The value of n is typically in the range from about 1.6 to 1.9, and preferably in the range from 1.7 to 1.8.

As shown in FIG. 2, the diffraction grating 13 is of the so-called surface relief type, having a two-dimensional periodic refractive index distribution realized by surface irregularities (projections and depressions) in the shape of circular or polygonal columns formed at the lattice points of an oblique lattice (parallelogram lattice) at the interface between the first electrode 12 and the light-emitting layer 14. The irregularities may be either such that parts of the first electrode 12 protrude or such that parts of the light-emitting layer 14 protrude.

Figure 3:
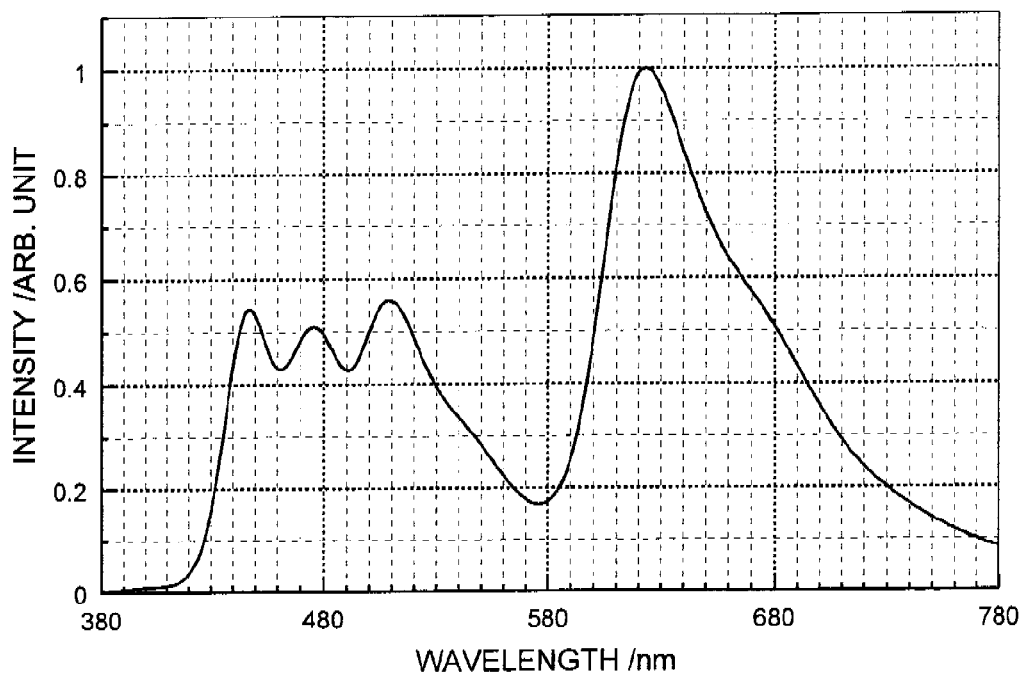
FIG. 3 The light emission spectrum of an organic EL element provided with no diffraction grating.

The light emission spectrum in the visible light region of an organic EL element having the same structure as the organic EL element 10 except for the absence of the diffraction grating 13 is shown in FIG. 3. This is a common white spectrum that offers excellent color rendering, having maxima in the vicinity of 630 nm for red, 510 nm for green, 475 nm for cyan, and 450 nm for blue. To obtain white, the three primary colors of red, green, and blue suffice; cyan light is added for enhanced color rendering.

The diffraction grating 13 shown in FIG. 2 has an oblique lattice with a=438 nm, b=379 nm, and c=313 nm, and there A=77.9°, B=57.8°, and C=44.3°. Here, when x- and y-axes and vectors p and q are defined as shown in FIG. 2, vectors p and q are the fundamental translational vectors of the oblique lattice such that $$\text{Vector } p = (p_x, p_y) = (c\cos B, c\sin B)$$
$$= (313\cos 57.8°, 313\sin 57.8°)$$
$$= (167, 265),$$

$$\text{Vector } q = (q_x, q_y) = (b\cos C, -b\sin C)$$
$$= (379\cos 44.3°, -379\sin 44.3°)$$
$$= (271, -265)$$

Here, the period $d_{MN}$ of the modulation structure on the diffraction grating 13 can be expressed using vector p and q and integers M and N. The period $d_{MN}$ is the interval between lines represented by (M, N) on the diffraction grating 13, and is given by $$d_{MN} = |p_x q_y - p_y q_x|/\sqrt{\{(Mq_y - Np_y)^2 + (Np_x - Mq_x)^2\}}$$

For example, in FIG. 2, (0, 1) lines are straight lines parallel to vector p and passing through the lattice points, and their interval $d_{01}$ is given by $$d_{01} = |167 \times (-265) - 265 \times 271|/\sqrt{\{(0 \times (-265) - 1 \times 265)^2 + (1 \times 167 - 0 \times 271)^2\}} = 371 \text{ nm}$$

Likewise, in FIG. 2, (1, 0) lines are straight lines parallel to vector q and passing through the lattice points, and their interval $d_{10}$ is 306 nm. On the other hand, (1, −1) lines are straight lines parallel to x-axis of FIG. 2 and passing through the lattice points, and their interval $d_{1-1}$ is 265 nm. Henceforth the periodicity of lines represented by (M, N) will be called the periodicity of order (M, N). Thus $d_{MN}$ is the period of the periodicity of order (M, N).

Of the light generated in the light-emitting layer 14, the part incident on the interface with the first electrode 12 at small incidence angles is transmitted through the first electrode 12 and the transparent substrate 11 to come out of the organic EL element 10; the part incident there at large incidence angles is, if the diffraction grating 13 is absent, totally reflected at the interface between the transparent substrate 11 and the first electrode 12 but is, when the diffraction grating 13 is present, diffracted by the diffraction grating 13 as described below so that it is transmitted through the first electrode 12 and the transparent substrate 11 to come out of the organic EL element 10.

Consider here a case where, of the light incident on the interface between the light-emitting layer 14 and the first electrode 12 at large incidence angles, the light whose effective wavelength $\lambda a = d_{01}$ travels in the direction indicated by arrow D in FIG. 2. This light experiences the periodicity of order (0, 1) of the diffraction grating 13 and fulfills the Bragg condition, and is thus diffracted at 180° from its travel direction, i.e. into the opposite direction (the direction indicated by arrow D1). Simultaneously, the light fulfills the Bragg condition and diffracted also in the direction perpendicular to the diffraction grating 13, i.e. the direction perpendicular to the plane of FIG. 2. Thus, the light that without the diffraction grating 13 would be totally reflected at the interface with the first electrode 12 and thereby guided inside the light-emitting layer 14 to escape to the side of the organic EL element 10 can be extracted out of the organic EL element 10 through the observation surface of its transparent substrate 11, resulting in enhanced light extraction efficiency.

Thus, since the above-mentioned periodicity of order (0, 1) is the period $d_{01} = 371$ nm, it diffracts, and enhances the extraction efficiency of, light whose effective wavelength $\lambda a$ in the organic EL element 10 is in the vicinity of 371 nm, i.e. red light whose wavelength $\lambda b$ in the air is in the vicinity of $\lambda a \times 1.7 = d_{01} \times n = 371 \times 1.7 = 630$ nm.

Likewise, in a case where, over the entire wavelength region of the white light emitted from the organic EL element 10, the effective refractive index n as light of different colors experiences is 1.7, the periodicities of orders (1, 0) and (1, −1) are $d_{10} \times n = 306 \times 1.7 = 520$ nm and $d_{1-1} \times n = 265 \times 1.7 = 450$ nm, and thus they enhance the extraction efficiency of green and blue light whose wavelengths $\lambda b$ in the air are in the vicinity of 520 nm and 450 nm respectively. These wavelengths are in the vicinity of three out of the four maxima of the spectrum shown in FIG. 3. Thus, by providing the diffraction grating 13, it is possible to enhance the extraction efficiency of light of three colors that when mixed composes white light. In this way, in the organic EL element 10 as a white light source, it is possible to obtain increased luminance without degrading the quality of white.

In a case where the effective refractive index n differs depending on wavelength, for example when, in the case described above, the effective refractive indices for light whose effective wavelengths $\lambda a$ in the organic EL element 10 are 371 nm, 306 nm, and 265 nm are $n_{01}$, $n_{10}$, and $n_{1-1}$ respectively, then the wavelengths $\lambda b$ of those light in the air are $371 \times n_{01}$, $306 \times n_{10}$, and $265 \times n_{1-1}$ respectively. In reality, the effective refractive index n, though slightly different depending on wavelength due to the refractive index dispersion of the materials, does not vary much and thus can be regarded as approximately identical in practical terms.

Now the wavelength of the light diffracted by the diffraction grating 13 will be considered. For example, in the case of the organic EL element with the light emission spectrum shown in FIG. 3, it is difficult to design the diffraction grating 13 with periodicities corresponding to the wavelengths corresponding to all the four maxima. Through research, however, the present inventors have confirmed that light in the wavelength regions in the vicinity of the maxima where the light has intensity of 65% or more of the intensity of the light of the wavelengths corresponding to the maxima can be diffracted with a diffraction grating, resulting in increased luminance of the organic EL element.

Figure 4:
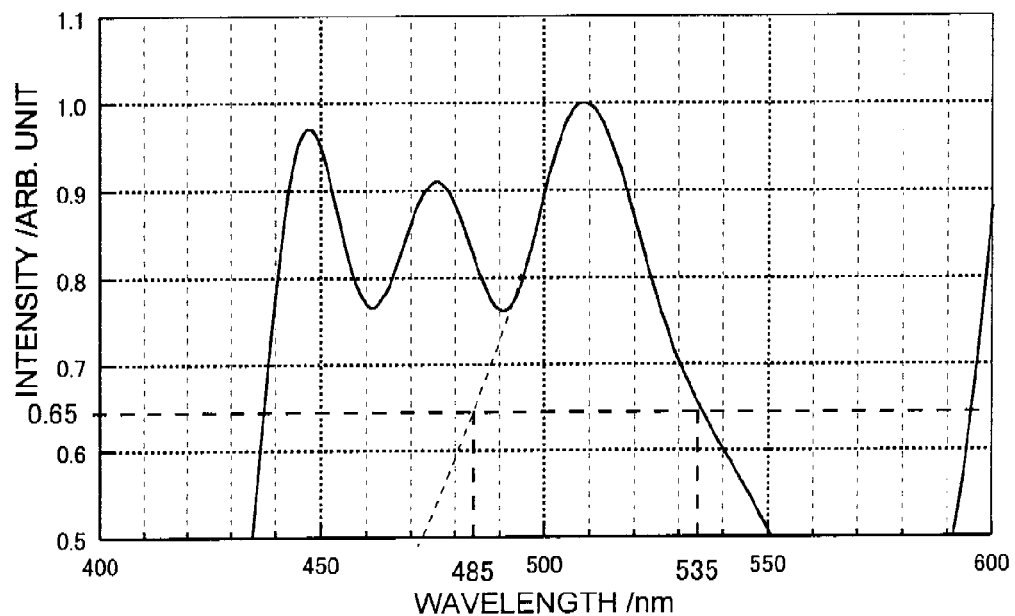
FIG. 4 The light emission spectrum of FIG. 3 as normalized in the vicinity of 510 nm.

This will be explained specifically with reference to FIG. 4. FIG. 4 shows the spectrum of FIG. 3 as normalized with respect to the 510 nm maximum. FIG. 4 shows that the wavelength region of light having intensity of 65% or more of the intensity of the light of 510 nm is from about 485 to 535 nm. Thus, by increasing the extraction efficiency of the light in this wavelength region by use of a diffraction grating, it is possible to increase the luminance of light at and in the vicinity of the 510 nm maximum, and thereby to increase the luminance of the organic EL element.

Likewise, in the light emission spectrum of FIG. 3, the wavelength regions in which the light intensity is 65% or more of that at the wavelengths corresponding to the maxima are, for red around 630 nm, from about 605 to 660 nm; for cyan around 475 nm, from about 450 to 500 nm; an for blue around 450 nm, from about 435 to 465 nm.

The foregoing reveals that, if light of one or more wavelengths in the red region (from 605 to 660 nm) and light of two or more wavelengths in the blue to green region (435 to 535 nm) can be diffracted with the periodicity of the diffraction grating 13, it is possible, in the organic EL element with the light emission spectrum shown in FIG. 3, to increase the luminance of the white light as a whole without degrading the quality of white.

In this way, by adopting an oblique lattice in the diffraction grating 13 and properly setting the grating constant, through diffraction of particular orders, it is possible, with a single diffraction grating, to enhance the extraction efficiency of red, green, and blue light that composes white light, and it is thereby possible to increase the luminance of the organic EL element 10 without degrading the quality of white. Moreover, it is possible to obtain satisfactory luminance even with a lower voltage applied to the organic EL element 10, and thus it is possible to use the organic EL element 10 over a long period.

The diffraction grating 13 may have any oblique lattice other than that shown in FIG. 2 so long as vectors p and q—the fundamental translational vectors—differ in magnitude and form an angle other than 90°. Cases in which vectors p and q are equal in magnitude are those involving square, triangular, or face-centered rectangular lattices, which will be dealt with later; cases in which vectors p and q form an angle of 90° are those involving square or simple rectangular lattices.

Through experiments, the present inventors have found out that, when the orders M and N of the diffraction grating 13 used to diffract light composing white light are six or more, it is impossible to effectively enhance light extraction efficiency. Accordingly, it is preferable that M and N fulfill $|M| \leq 5$ and $|N| \leq 5$ simultaneously.

With a one-dimensional lattice, when the direction of travel of light is perpendicular to the direction of refractive index modulation, no diffraction occurs. By contrast, with a two-dimensional lattice, for example, even in light in the vicinity of 630 nm traveling in the direction perpendicular to the periodicity of order (0, 1) in FIG. 2, diffraction due to periodicities of higher orders occurs, and thus some diffraction always occurs.

Second Embodiment

Figure 5:
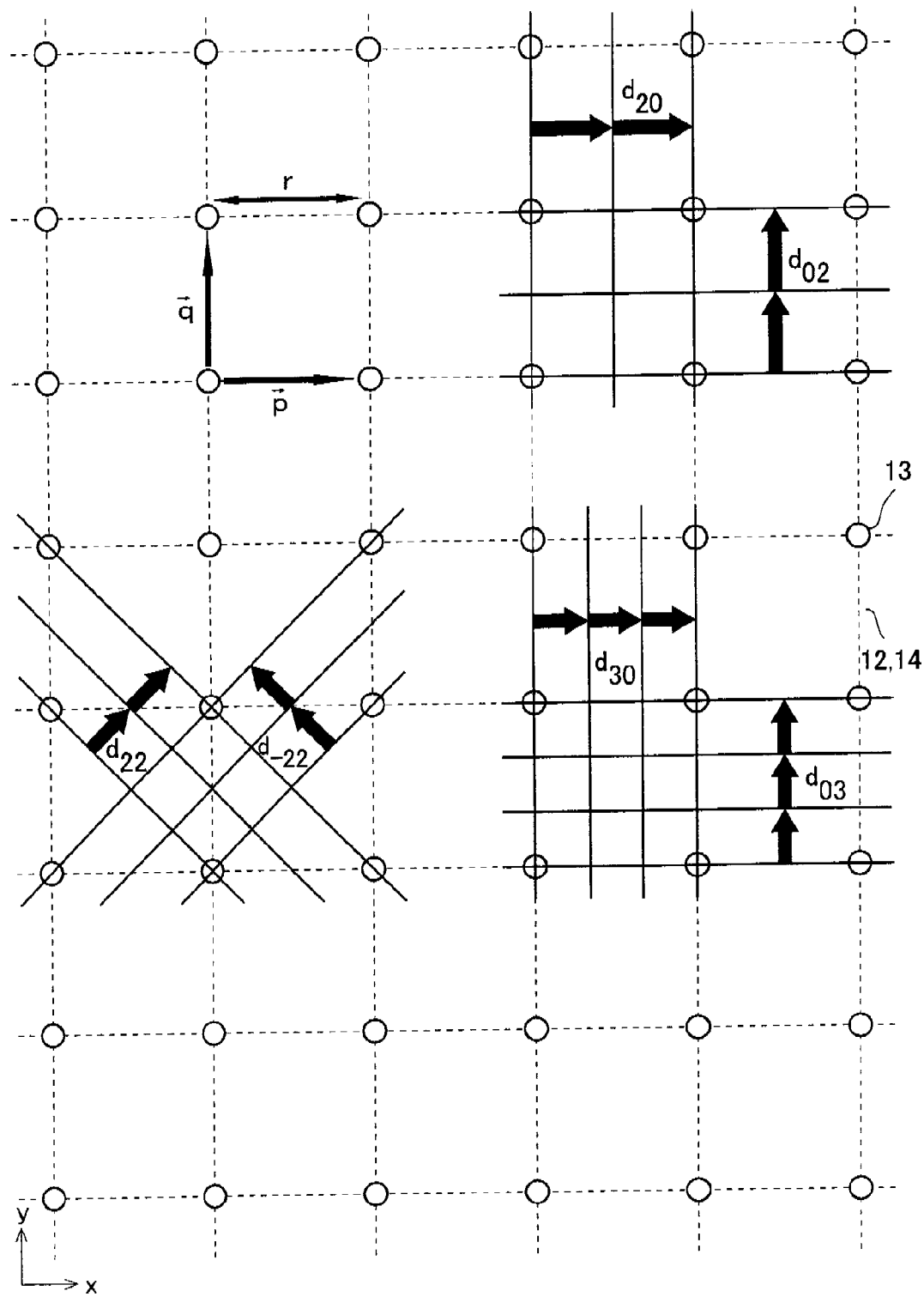
FIG. 5 An enlarged partial plan view of a diffraction grating having a square lattice according to a second embodiment of the invention.

A second embodiment of the present invention will be described below with reference to the drawings. FIG. 5 is an enlarged partial plan view of a diffraction grating according to the second embodiment. The second embodiment is similar to the first embodiment in the structure of the organic EL element 10, but differs from it in that the diffraction grating has a square lattice. Accordingly, substantially the same parts between the two embodiments are identified by common reference signs.

In this embodiment, as shown in FIG. 5, the diffraction grating 13 has a square lattice. Here, when the grating constant of the square lattice is r, defining x- and y-axes and vectors p and q—the fundamental translational vectors—as shown in FIG. 5 gives Vector $p=(r,0)$ Vector $q=(0,r)$ Accordingly, substituting $(p_x, p_y)=(r, 0)$ and $(q_x, q_y)=(0, r)$ in the formula representing the period $d_{MN}$ of the modulation structure on the diffraction grating 13 gives $d_{MN}=r/\sqrt{(M^2+N^2)}$ For example, assume that the grating constant r of the square lattice in FIG. 5 is 772 nm, and that, over the entire wavelength region of the white light emitted from the organic EL element 10, the effective refractive index n as light of different colors experiences is 1.7. Then the period $d_{20}$ of the periodicity of order (2, 0) shown in FIG. 5 is $d_{20}=772/\sqrt{(2^2+0^2)}=386$ nm, and likewise the periods of the periodicities of orders (2, 2) and (3, 0) are $d_{22}=273$ nm and $d_{30}=257$ nm respectively.

The diffraction grating 13 in FIG. 5 has a square lattice, and, owing to its symmetry, the period $d_{20}$ of the periodicity of order (2, 0) is equal to the periods $d_{-20}$, $d_{02}$, and $d_{0-2}$ of the periodicities of orders (−2, 0), (0, 2), and (0, −2). Accordingly, in this embodiment, these periodicities are collectively called the order (2, 0)—group periodicities. The periodicities of orders (−2, 0) and (0, −2) are opposite in direction to the periodicities of orders (2, 0) and (0, 2) respectively.

Likewise, the periodicities of orders (2, 2), (−2, 2), (−2, −2), and (2, −2), whose periods are equal to $d_{22}$, are collectively called the order (2, 2)—group periodicities, and the periodicities of orders (3, 0), (−3, 0), (0, 3), and (0, −3), whose periods are equal to $d_{30}$, are collectively called the order (3, 0)—group periodicities.

The order (2, 0)—group periodicities, the order (2, 2)—group periodicities, and the order (3, 0)—group periodicities can enhance the extraction efficiency of light whose effective wavelengths λa in the organic EL element 10 are in the vicinity of 386 nm, 273 nm, and 257 nm respectively, i.e. red, green, and blue light whose wavelengths λb in the air are in the vicinity of 657 nm, 465 nm, and 438 nm respectively. That is, it is possible to enhance the extraction efficiency of light of three colors that when mixed composes white light. Thus, in the organic EL element 10 as a white light source, it is possible to obtain increased luminance without degrading the quality of white.

In this embodiment, it is assumed that the grating constant r of the square lattice is 842 nm, and that, over the entire wavelength region of the white light emitted from the organic EL element 10, the effective refractive index n as light of different colors experiences is 1.7. In this case, the period $d_{21}$ of the periodicity of order (2, 1) shown in FIG. 6 is $d_{21}=842/\sqrt{(2^2+1^2)}=376$ nm, and likewise the period $d_{31}$ of the periodicity of order (3, 1) is $d_{31}=266$ nm.

Figure 6:
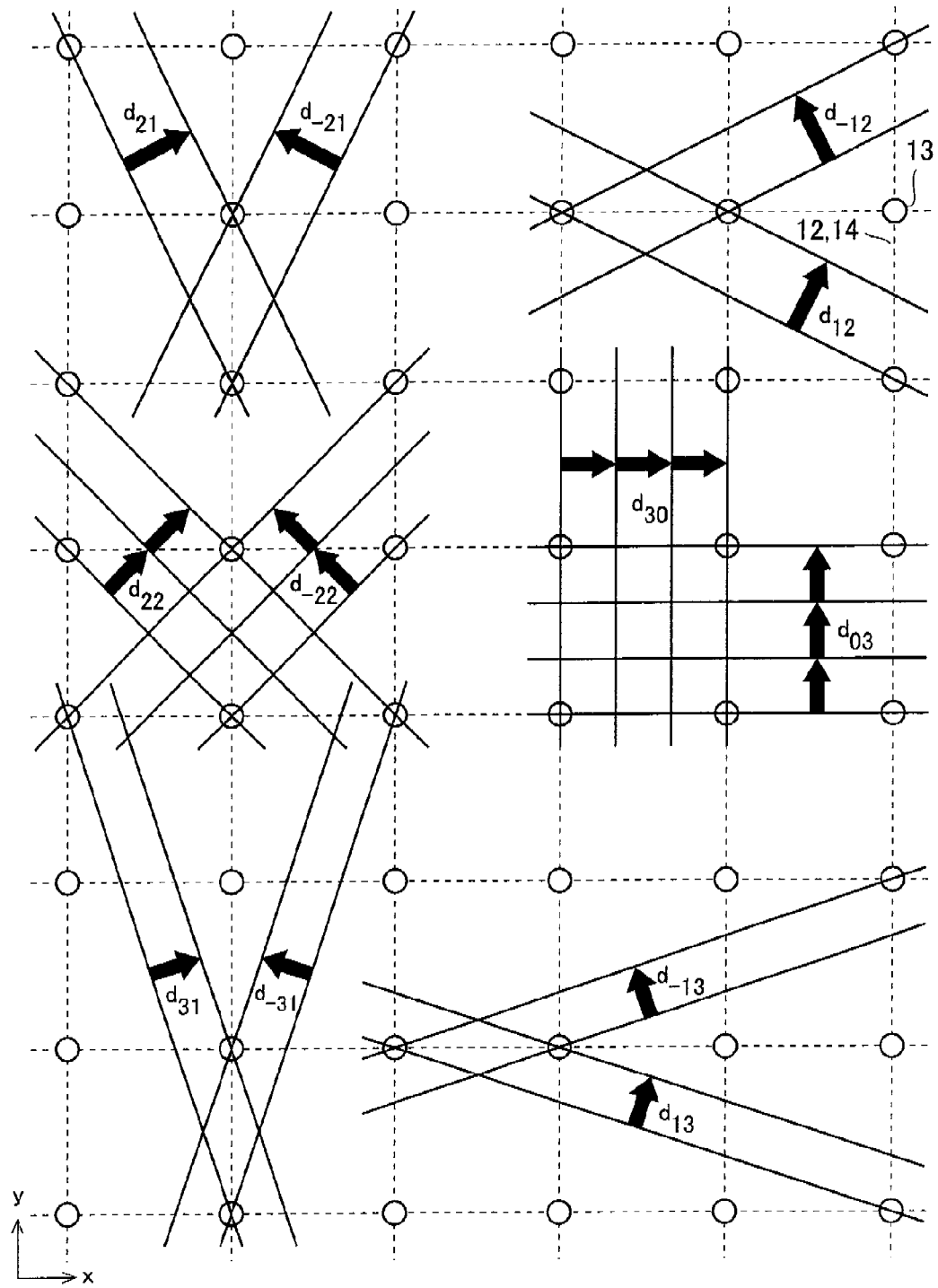
FIG. 6 An enlarged partial plan view of another diffraction grating having a square lattice according to a second embodiment of the invention.

Owing to the symmetry of the square lattice, the period $d_{21}$ is equal to the periods of the periodicities of orders (−2, 1), (1, 2), and (−1, 2) shown in FIG. 6 and to the periods of the periodicities opposite in direction to them, namely the periodicities of orders (−2, −1), (2, −1), (−1, −2), and (1, −2). Accordingly, in this embodiment, these periodicities are collectively called the order (2, 1)—group periodicities.

Likewise, the period $d_{31}$ is equal to the periods of the periodicities of orders (−3, 1), (1, 3), and (−1, 3) and to the periods of the periodicities opposite in direction to them, namely the periodicities of orders (−3, −1), (3, −1), (−1, −3), and (1, −−3). Accordingly, in this embodiment, these periodicities are collectively called the order (3, 1)—group periodicities. The period of the order (2, 1)—group periodicities and that of the order (3, 1)—group periodicities are $d_{22}=298$ nm and $d_{30}=281$ nm respectively.

The order (2, 1)—group periodicities, the order (2, 2)—group periodicities, the order (3, 0)—group periodicities, and the order (3, 1)—group periodicities can enhance the extraction efficiency of light whose effective wavelengths λa in the organic EL element 10 are in the vicinity of 376 nm, 298 nm, 281 nm, and 266 nm respectively, i.e. red, green, cyan, and blue light whose wavelengths λb in the air are in the vicinity of 640 nm, 506 nm, 477 nm, and 453 nm respectively. That is, it is possible to enhance the extraction efficiency of light of four colors that when mixed composes white light. Thus, in the organic EL element 10 as a white light source, it is possible to obtain increased luminance without degrading the quality of white, and in addition to achieve enhanced color rendering.

In this embodiment, as with an oblique lattice, it is preferable that M and N fulfill $|M| \leq 5$ and $|N| \leq 5$ simultaneously. Table 2 shows, for a case where, over the entire wavelength region of the white light emitted from the organic EL element 10, the effective refractive index n as light of different colors experiences is 1.7, the grating constant r of the square lattice, the order (M, N) of periodicity, and the center wavelengths at which that order enhances extraction efficiency. The underscored wavelengths are those belonging to the red region (from 605 to 660 nm) or the blue to green region (from 435 to 535 nm). The grating constant r appears in the bottom row of Table 2; the wavelength and the grating constant are given in nm. In Table 2, $L=M^2+N^2$; the greater the value of L, the smaller the period $d_{MN}$.

In Table 2, in the case where r=371 nm or 524 nm, there are a total of only two underscored wavelengths, one in the red region and one in the blue to green region. Thus, with the grating constant equal to one of those values, the diffraction grating 13 can increase the luminance of the organic EL element but with degraded quality of white. This requires extra adjustment, such as adjustment of the original white balance through adjustment of the balance of the red, blue, and green dopants. With the grating constant equal to any of the other values, light can be diffracted at one or more wavelengths in the red region and at two or more wavelengths in the blue to green region; thus it is possible to increase the luminance of the organic EL element 10 without degrading the quality of white.

Accordingly, substituting $(p_x, p_y)=(r, 0)$ and $(q_x, q_y)=(-r/2, \sqrt{3}\times r/2)$ in the formula representing the period $d_{MN}$ of the modulation structure on the diffraction grating 13 gives $$d_{MN}=\sqrt{3}\times r/\{2\times\sqrt{(M^2+MN+N^2)}\}$$

Figure 7:
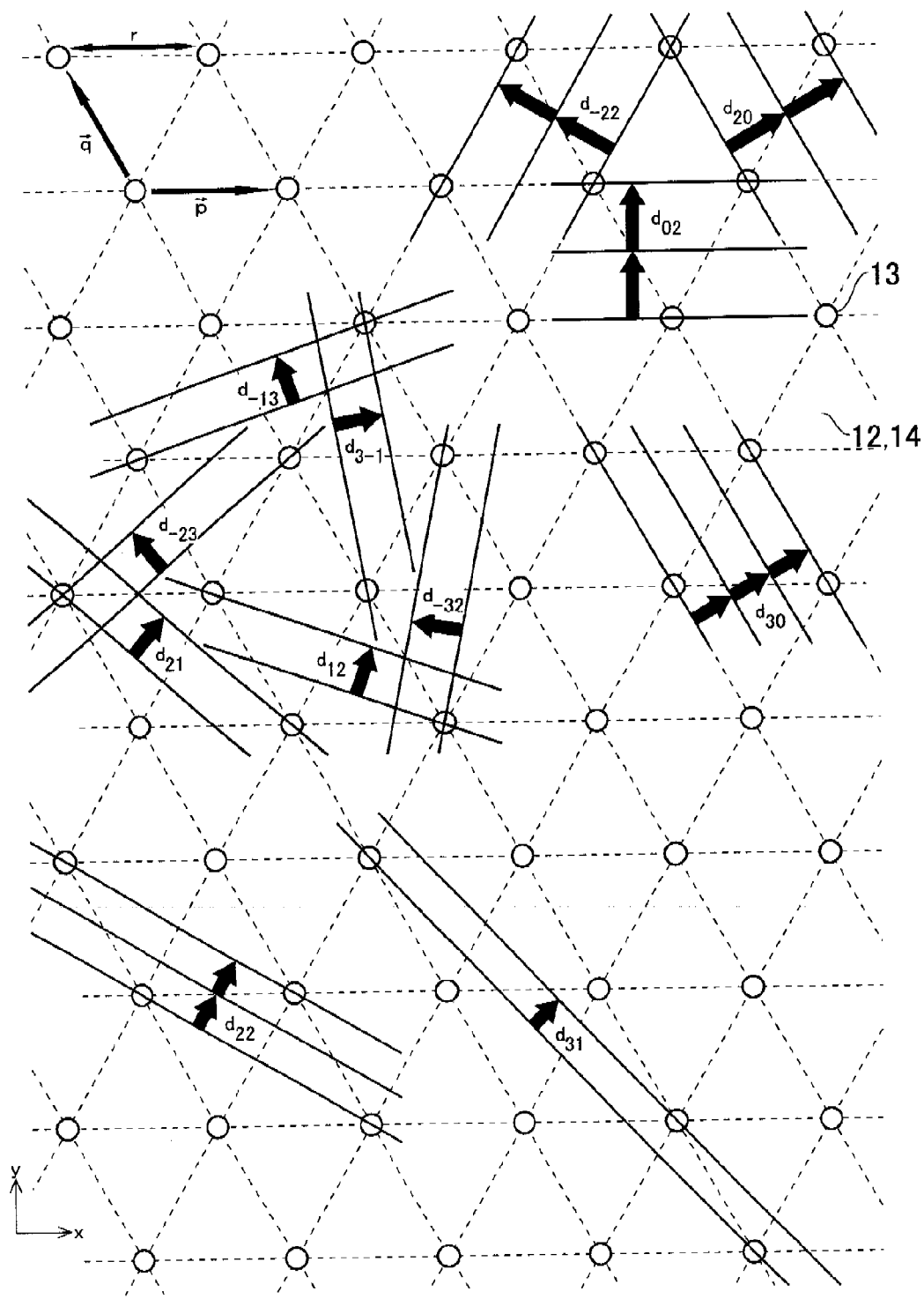
FIG. 7 An enlarged partial plan view of a diffraction grating having a triangular lattice according to a third embodiment of the invention.

For example, assume that the grating constant r of the triangular lattice in FIG. 7 is 894 nm, and that, over the entire wavelength region of the white light emitted from the organic EL element 10, the effective refractive index n as light of different colors experiences is 1.7. Then the period $d_{20}$ of the periodicity of order (2, 0) shown in FIG. 7 is $d_{20}=1.73\times894/\{2\times\sqrt{(2^2+2\times0+0^2)}\}=387$ nm, and likewise the periods of the periodicities of orders (2, 1) and (3, 0) are $d_{21}=292$ nm and $d_{30}=258$ nm respectively.

The diffraction grating 13 in FIG. 7 has a triangular lattice, and, owing to its symmetry, the period $d_{20}$ of the periodicity of order (2, 0) is equal to the periods $d_{-22}$, $d_{02}$, $d_{-20}$, $d_{2-2}$, and $d_{0-2}$ of the periodicities of orders (−2, 2) and (0, 2) shown in FIG. 7 and the periodicities opposite in direction to them, namely the periodicities of orders (−2, 0), (2, −2), and (0, −2). Accordingly, in this embodiment, these periodicities are collectively called the order (2, 0)—group periodicities.

Likewise, the periodicities of orders (−2, 3), (1, 2), (−3, 2), (3, −1), and (−1, 3), whose periods equals $d_{21}$, and the periodicities opposite in direction to them, namely the periodici-

TABLE 2

| M | N | L | | | | | | | | | | | | | |
|---|---|---|---|---|---|---|---|---|---|---|---|---|---|---|---|
| 1 | 0 | 1 | 630 | | | | | | | | | | | | |
| 1 | 1 | 2 | 445 | 630 | | | | | | | | | | | |
| 2 | 0 | 4 | 315 | 445 | 657 | | | | | | | | | | |
| 2 | 1 | 5 | 282 | 398 | 588 | 640 | | | | | | | | | |
| 2 | 2 | 8 | 223 | 315 | 465 | 506 | 630 | | | | | | | | |
| 3 | 0 | 9 | 210 | 297 | 438 | 477 | 594 | 630 | | | | | | | |
| 3 | 1 | 10 | 199 | 282 | 416 | 453 | 563 | 598 | 630 | | | | | | |
| 3 | 2 | 13 | 175 | 247 | 364 | 397 | 494 | 524 | 553 | 630 | | | | | |
| 4 | 0 | 16 | 158 | 223 | 329 | 358 | 445 | 473 | 498 | 568 | 630 | | | | |
| 4 | 1 | 17 | 153 | 216 | 319 | 347 | 432 | 458 | 483 | 551 | 611 | 630 | | | |
| 3 | 3 | 18 | 148 | 210 | 310 | 337 | 420 | 445 | 470 | 535 | 594 | 612 | 630 | | |
| 4 | 2 | 20 | 141 | 199 | 294 | 320 | 398 | 423 | 445 | 508 | 563 | 581 | 598 | 630 | |
| 4 | 3 | 25 | 126 | 178 | 263 | 286 | 356 | 378 | 398 | 454 | 504 | 520 | 535 | 563 | 630 |
| 5 | 0 | | | | | | | | | | | | | | |
| 5 | 1 | 26 | 124 | 175 | 258 | 281 | 349 | 371 | 391 | 445 | 494 | 509 | 524 | 553 | 618 | 630 |
| 5 | 2 | 29 | 117 | 165 | 244 | 266 | 331 | 351 | 370 | 422 | 468 | 482 | 496 | 523 | 585 | 597 | 630 |
| 4 | 4 | 32 | 111 | 158 | 232 | 253 | 315 | 334 | 352 | 402 | 445 | 459 | 473 | 498 | 557 | 568 | 600 |
| 5 | 3 | 34 | 108 | 153 | 225 | 245 | 306 | 324 | 342 | 390 | 432 | 445 | 458 | 483 | 540 | 551 | 582 |
| 5 | 4 | 41 | 98 | 139 | 205 | 223 | 278 | 295 | 311 | 355 | 394 | 406 | 417 | 440 | 492 | 502 | 530 |
| 5 | 5 | 50 | 89 | 126 | 186 | 202 | 252 | 267 | 282 | 321 | 356 | 367 | 378 | 398 | 445 | 454 | 480 |
| | r | | 371 | 524 | 772 | 841 | 1048 | 1111 | 1172 | 1336 | 1482 | 1528 | 1572 | 1657 | 1853 | 1890 | 1996 |

Third Embodiment

A third embodiment of the present invention will be described below with reference to the drawings. FIG. 7 is an enlarged partial plan view of a diffraction grating according to the second embodiment. The third embodiment is similar to the first embodiment in the structure of the organic EL element 10, but differs from it in that the diffraction grating has a triangular lattice. Accordingly, substantially the same parts between the two embodiments are identified by common reference signs.

In this embodiment, as shown in FIG. 7, the diffraction grating 13 has a triangular lattice. Here, when the grating constant of the square lattice is r, defining x- and y-axes and vectors p and q—the fundamental translational vectors—as shown in FIG. 7 gives Vector $p=(r,0)$ Vector $q=(-r/2,\sqrt{3}\times r/2)$ ties of orders (−2, −1), (2, −3), (−1, −2), (3, −2), (−3, 1), and (1, −3), are collectively called the order (2, 1)—group periodicities; the periodicities of orders (3, 0), (−3, 3), and (0, 3), whose periods equals $d_{30}$, and the periodicities opposite in direction to them, namely the periodicities of orders (−3, 0), (3, −3), and (0, −3), are collectively called the order (3, 0)—group periodicities.

The order (2, 0)—group periodicities, the order (2, 1)—group periodicities, and the order (3, 0)—group periodicities can enhance the extraction efficiency of light whose effective wavelengths λa in the organic EL element 10 are in the vicinity of 387 nm, 292 nm, and 258 nm respectively, i.e. red, cyan, and blue light whose wavelengths λb in the air are in the vicinity of 658 nm, 497 nm, and 439 nm respectively. That is, it is possible to enhance the extraction efficiency of light of three colors that when mixed composes white light. Thus, in the organic EL element 10 as a white light source, it is possible to obtain increased luminance without degrading the quality of white.

In this embodiment, it is assumed that the grating constant r of the triangular lattice is 1 132 nm, and that, over the entire wavelength region of the white light emitted from the organic EL element 10, the effective refractive index n as light of different colors experiences is 1.7. In this case, the period $d_{21}$ of the periodicity of order (2, 1) shown in FIG. 7 is $d_{21}=1.73\times1\ 132/\{2\times\sqrt{(2^2+2\times1+1^2)}\}=370$ nm, and likewise the periods of the periodicities of orders (2, 2) and (3, 1) are $d_{22}=283$ nm and $d_{31}=272$ nm.

As described above, the period $d_{21}$ is equal to the periods of the order (2, 1)—group periodicities, namely the periodicities of orders (–2, 3), (1, 2), (–3, 2), (3, –1), and (–1, 3), and to the periods of the periodicities opposite in direction to them, namely the periodicities of orders (–2, –1), (2, –3), (–1, –2), (3, –2), (–3, 1), and (1, –3).

Likewise, the period $d_{22}$ is equal to the periods of the periodicities of orders (2, 4) and (–4, 2) and to the periods of the periodicities opposite in direction to them, namely the periodicities of orders (–2, –2), (–2, 4), and (4, –2). Accordingly, in this embodiment, these periodicities are collectively called the order (2, 2)—group periodicities.

Also with respect to the period $d_{31}$, it is equal to the periods of the periodicities of orders (–3, 4), (1, 3), (–4, 3), (4, –1), and (–1, 4) and to the periods of the periodicities opposite in direction to them, namely the periodicities of orders (–3, –1), (3, 4), (–1, –3), (4, –3), (–4, 1), and (1, 4). Accordingly, in this embodiment, these periodicities are collectively called the order (3, 1)—group periodicities.

The order (2, 1)—group periodicities, the order (2, 2)—group periodicities, and the order (3, 1)—group periodicities can enhance the extraction efficiency of light whose effective wavelengths λa in the organic EL element 10 are in the vicinity of 370 nm, 282 nm, and 271 nm respectively, i.e. red, green, and blue light whose wavelengths λb in the air are in the vicinity of 630 nm, 481 nm, and 462 nm respectively. That is, it is possible to enhance the extraction efficiency of light of three colors that when mixed composes white light. Thus, in the organic EL element 10 as a white light source, it is possible to obtain increased luminance without degrading the quality of white.

In this embodiment, as with an oblique lattice, it is preferable that M and N fulfill |M|≦5 and |N|≦5 simultaneously. Table 3 shows, for a case where, over the entire wavelength region of the white light emitted from the organic EL element 10, the effective refractive index n as light of different colors experiences is 1.7, the grating constant r of the triangular lattice, the order (M, N) of periodicity, and the wavelengths at which that order causes diffraction. The underscored wavelengths are those belonging to the red region (from 605 to 660 nm) or the blue to green region (from 435 to 535 nm). The grating constant r appears in the bottom row of Table 3; the wavelength and the grating constant are given in nm. In Table 3, $L=M^2+MN+N^2$; the greater the value of L, the smaller the period $d_{MN}$.

In Table 3, in the case where r=428 nm or 741 nm, there are a total of only two underscored wavelengths, one in the red region and one in the blue to green region. Thus, with the grating constant equal to one of those values, the diffraction grating 13 can increase the luminance of the organic EL element 10 but with degraded quality of white. This requires extra adjustment, such as adjustment of the original white balance through adjustment of the balance of the red, blue, and green dopants. With the grating constant equal to any of the other values, light can be diffracted at one or more wavelengths in the red region and at two or more wavelengths in the blue to green region; thus it is possible to increase the luminance of the organic EL element 10 without degrading the quality of white.

TABLE 3

| M | N | L | | | | | | | | | | | | | | |
|---|---|---|---|---|---|---|---|---|---|---|---|---|---|---|---|---|
| 1 | 0 | 1 | <u>630</u> | | | | | | | | | | | | | |
| 1 | 1 | 3 | 364 | <u>630</u> | | | | | | | | | | | | |
| 2 | 0 | 4 | 315 | 546 | <u>658</u> | | | | | | | | | | | |
| 2 | 1 | 7 | 238 | 412 | <u>497</u> | <u>630</u> | | | | | | | | | | |
| 3 | 0 | 9 | 210 | 364 | <u>439</u> | 556 | <u>630</u> | | | | | | | | | |
| 2 | 2 | 12 | 182 | 315 | 380 | <u>481</u> | 546 | <u>630</u> | | | | | | | | |
| 3 | 1 | 13 | 175 | 303 | 365 | <u>462</u> | <u>524</u> | <u>605</u> | <u>630</u> | | | | | | | |
| 4 | 0 | 16 | 158 | 273 | 329 | 417 | <u>473</u> | 546 | 568 | <u>630</u> | | | | | | |
| 3 | 2 | 19 | 145 | 250 | 302 | 382 | 434 | <u>501</u> | <u>521</u> | 578 | <u>630</u> | | | | | |
| 4 | 1 | 21 | 137 | 238 | 287 | 364 | 412 | <u>476</u> | <u>496</u> | 550 | 599 | <u>630</u> | | | | |
| 5 | 0 | 25 | 126 | 218 | 263 | 333 | 378 | <u>436</u> | <u>454</u> | <u>504</u> | 549 | 577 | <u>630</u> | | | |
| 3 | 3 | 27 | 121 | 210 | 253 | 321 | 364 | 420 | <u>437</u> | <u>485</u> | <u>528</u> | 556 | <u>606</u> | <u>630</u> | | |
| 4 | 2 | 28 | 119 | 206 | 249 | 315 | 357 | 412 | 429 | <u>476</u> | <u>519</u> | 546 | 595 | <u>619</u> | <u>630</u> | |
| 5 | 1 | 31 | 113 | 196 | 236 | 299 | 339 | 392 | 408 | <u>453</u> | <u>493</u> | <u>519</u> | 566 | 588 | 599 | <u>630</u> |
| 4 | 3 | 37 | 104 | 179 | 216 | 274 | 311 | 359 | 373 | 414 | <u>451</u> | <u>475</u> | <u>518</u> | 538 | 548 | 577 | <u>630</u> |
| 5 | 2 | 39 | 101 | 175 | 211 | 267 | 303 | 349 | 364 | 404 | <u>440</u> | <u>462</u> | <u>504</u> | <u>524</u> | <u>534</u> | 562 | <u>614</u> | <u>630</u> |
| 4 | 4 | 48 | 91 | 158 | 190 | 241 | 273 | 315 | 328 | 364 | 396 | 417 | <u>455</u> | <u>473</u> | <u>481</u> | <u>506</u> | 553 | 568 |
| 5 | 3 | 49 | 90 | 156 | 188 | 238 | 270 | 312 | 324 | 360 | 392 | 412 | <u>450</u> | <u>468</u> | <u>476</u> | <u>501</u> | 547 | 562 |
| 5 | 4 | 61 | 81 | 140 | 168 | 213 | 242 | 279 | 291 | 323 | 352 | 370 | 403 | 419 | 427 | <u>449</u> | <u>491</u> | <u>504</u> |
| 5 | 5 | 75 | 73 | 126 | 152 | 192 | 218 | 252 | 262 | 291 | 317 | 333 | 364 | 378 | 385 | 405 | <u>442</u> | <u>454</u> |
| | | r | 428 | 741 | 894 | 1132 | 1284 | 1482 | 1543 | 1712 | 1865 | 1961 | 2140 | 2224 | 2264 | 2383 | 2603 | 2672 |

The first to third embodiments described above deal with cases where the diffraction grating 13 has an oblique, square, or triangular lattice. Since the diffraction grating 13 has simply to have translational symmetry, however, it is also possible to use instead a simple rectangular lattice as shown in FIG. 8 or a face-centered rectangular lattice as shown in FIG. 9.

Figure 8:
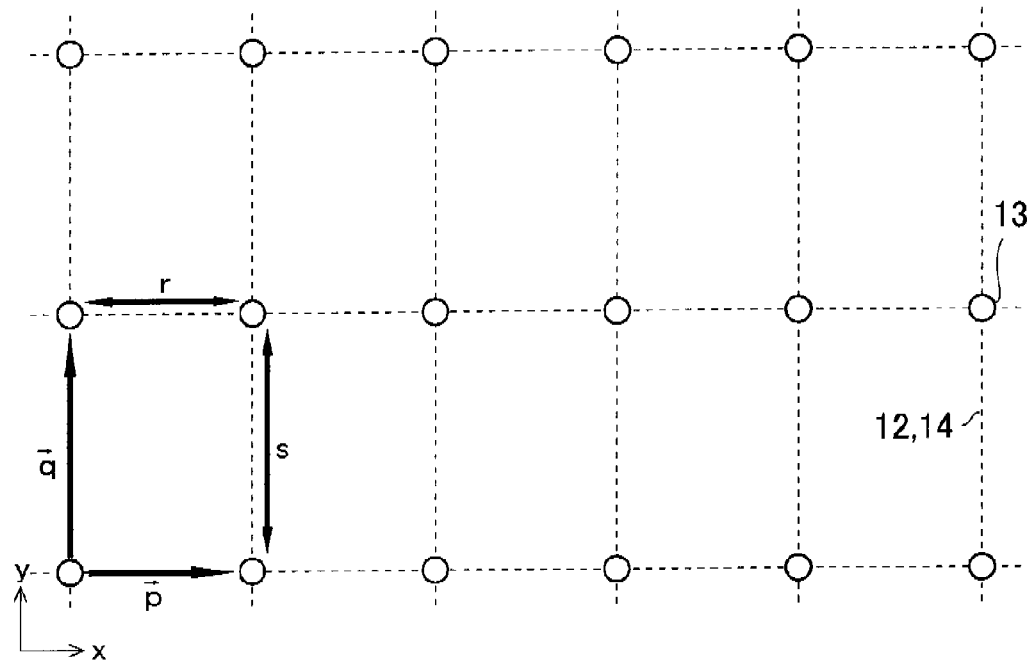
FIG. 8 An enlarged partial plan view of a diffraction grating having a simple rectangular lattice according to another embodiment of the invention.

In the case of the simple rectangular lattice shown in FIG. 8, when the grating constants are r and s, defining x- and y-axes and vectors p and q—the fundamental translational vectors—as shown in FIG. 8 gives Vector $p=(r,0)$ Vector $q=(0,s)$ Accordingly, substituting $(p_x, p_y)=(r, 0)$ and $(q_x, q_y)=(0, s)$ in the formula representing the period $d_{MN}$ of the modulation structure on the diffraction grating 13 gives $$d_{MN}=rs/\sqrt{\{M^2s^2+N^2r^2\}}$$

Figure 9:
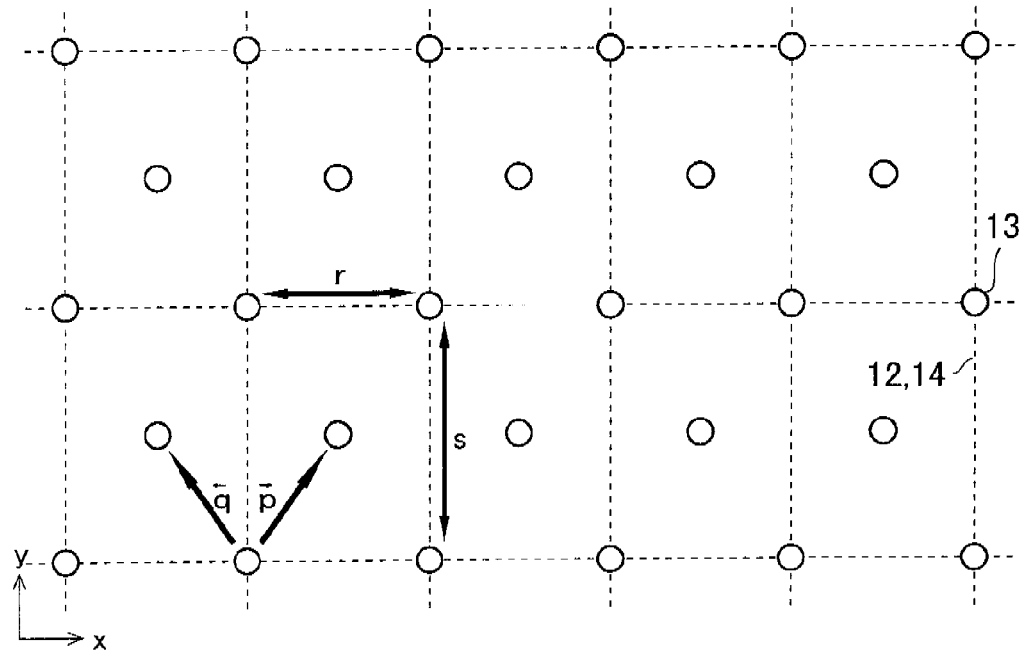
FIG. 9 An enlarged partial plan view of a diffraction grating having a face-centered rectangular lattice according to another embodiment of the invention.
Figure 10:
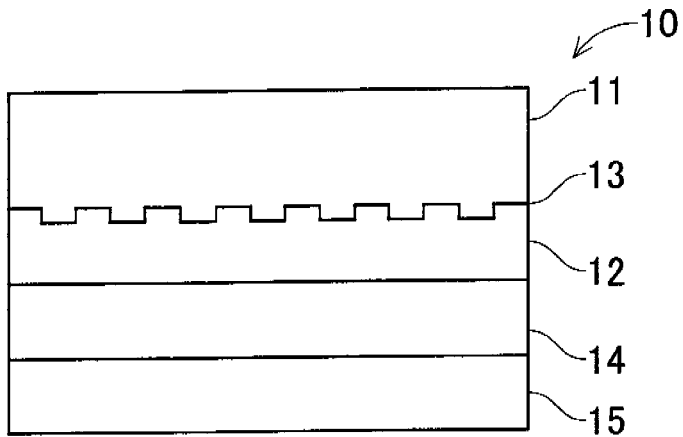
FIG. 10 An outline structure diagram of an organic EL element according to another embodiment of the invention.
Figure 11:
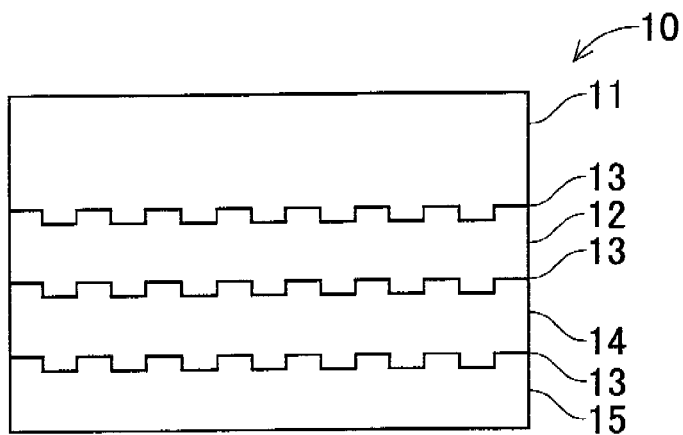
FIG. 11 An outline structure diagram of an organic EL element according to another embodiment of the invention.
Figure 12:
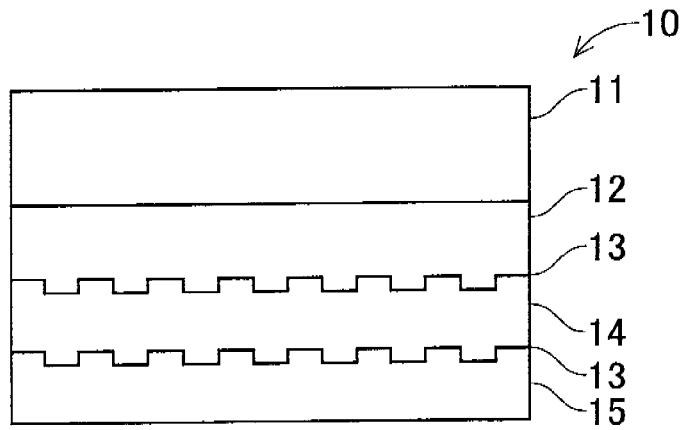
FIG. 12 An outline structure diagram of an organic EL element according to another embodiment of the invention.

Likewise, in the case of the face-centered rectangular lattice shown in FIG. 9, when the grating constants are r and s, defining x- and y-axes and vectors p and q—the fundamental translational vectors—as shown in FIG. 9 gives Vector $p=(r/2, s/2)$ Vector $q=(-r/2, s/2)$ Accordingly, the period $d_{MN}$ of the modulation structure is given by $d_{MN}=rs/\sqrt{\{(M-N)^2s^2+(M+N)^2r^2\}}$ In these cases also, the wavelength λb in the air of light diffracted by the periodicity or order (M, N) is given by $λb=n \times d_{MN}$ Although the first to third embodiments described above deal with cases in which the diffraction grating 13 is provided at the interface between the first electrode 12 and the light-emitting layer 14, the diffraction grating 13 may instead be provided at the interface between the transparent substrate 11 and the first electrode 12 as shown in FIG. 10; it may instead be provided at the interface between the light-emitting layer 14 and the second electrode 15, or inside the transparent substrate 11, in the vicinity of the first electrode 12. The surface irregularities (projections and depressions) formed at the lattice points of the diffraction grating 13 may protrude from either side. As shown in FIGS. 11 and 12, it is possible even to provide diffraction gratings at two or more of the interfaces mentioned above. FIG. 11 is an outline structure diagram of the organic EL element 10 in a case where three diffraction gratings 13 are provided, one at the interface between the transparent substrate 11 and the first electrode 12, one at the interface between the first electrode 12 and the light-emitting layer 14, and one at the interface between the light-emitting layer 14 and the second electrode 15. FIG. 12 is an outline structure diagram of the organic EL element 10 in a case where two diffraction gratings 13 are provided, one at the interface between the first electrode 12 and the light-emitting layer 14 and one at the interface between the light-emitting layer 14 and the second electrode 15.

(Example of Use of the Organic El Element)

Figure 13:
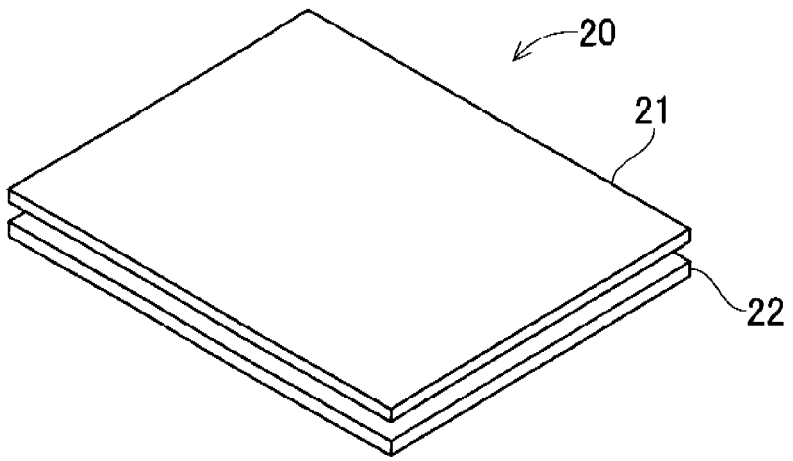
FIG. 13 A perspective view of a display device according to the invention.

An example of how the organic EL element of the embodiments described above is used in a device will be described below. The following example takes up a liquid crystal display device provided with an organic EL element as a backlight. FIG. 13 is a perspective view of the liquid crystal display device provided with an organic EL element as a white light source for backlighting. The liquid crystal display device 20 comprises a liquid crystal panel 21 and a backlight 22. The liquid crystal panel 21 is of the transparent or semi-transparent type having a liquid crystal layer held between a pair of electroded substrates (each substrate having provided on it, as necessary, a light alignment film, an insulating film, a color filter, a black matrix, a polarizing element, etc.). Also provided is a drive circuit for applying a voltage between the electrodes of the top and bottom substrates to switch the liquid crystal layer. The backlight 22 is the organic EL element 10 described in connection with the embodiments presented above, and is arranged with the transparent substrate 11 facing the liquid crystal panel 21. With this construction, high-luminance white light from the backlight 22 is transmitted through the liquid crystal panel 21 to make the image displayed on the liquid crystal panel 21 sharp. Moreover, since the backlight 22 is an organic EL element, it has a long lifetime. In this liquid crystal display device 20, the use of the organic EL element as the backlight 22 helps reduce the electric power used for a white light source, and thus helps accordingly reduce the electric power consumed by the device as a whole.

In the backlight 22 used in the liquid crystal display device 20, it is preferable either to use as the transparent substrate 11 one having refractive index anisotropy and light diffusivity, or to lay on the surface of the transparent substrate 11 facing the liquid crystal panel 21 at least one of a birefringent sheet capable of changing the polarization direction of light and a light-diffusive sheet. The reasons will be described below.

The light confined inside the backlight 22 due to total reflection at the interfaces between the electrode layers, organic layer, substrates, etc. composing the backlight 22 contains S-polarized and P-polarized light. S-polarized light is light that has an electric-field component only in the direction perpendicular to its travel direction and parallel to the transparent substrate 11, and P-polarized light is light that has a magnetic-field component only in the direction perpendicular to its travel direction and parallel to the transparent substrate 11. The light diffracted by the diffraction grating 13 and extracted out of the backlight 22 is polarized according to the direction of the periodicity that has affected the light. The direction of polarization is, with S-polarized light, perpendicular to the direction of period modulation and, with P-polarized light, parallel to the direction of period modulation. Thus, the light extracted by the diffraction grating 13 has been affected by different periodicities in different directions depending on wavelength, and therefore, when extracted, it is polarized in different directions at different wavelengths. Since light polarized in the direction perpendicular to the polarization direction of the liquid crystal panel 21 is not transmitted through the liquid crystal panel 21, this breaks the white balance of the backlight 22.

To overcome this inconvenience, the direction of polarization needs to be changed by some means. Here, changing the direction of polarization means changing the polarization direction of linearly polarized light from one direction to another, or turning linearly polarized light into non-linearly polarized light such as elliptically or circularly polarized light, or turning non-linearly polarized light such as elliptically or circularly polarized light into linearly polarized light. The direction of polarization can be changed by a method exploiting birefringence or by a method exploiting scattering. Thus, either by use of, as the transparent substrate 11, one having at least one of birefringence—capable of changing the polarization direction of light—and light diffusivity, or by laying on the surface of the transparent substrate 11 facing the liquid crystal panel 21, i.e. the light exit surface of the transparent substrate 11, at least one of a birefringent sheet or a light-diffusive sheet as described above, it is possible to cancel the polarization of the light entering the liquid crystal panel 21, and thereby to make the image displayed on the liquid crystal panel 21 sharp without breaking the white balance. Since the polarization by the diffraction grating 13 is particularly notable with an oblique lattice because of its low degree of symmetry, the laying of such sheets etc. is more effective when the diffraction grating 13 has an oblique lattice.

Figure 14:
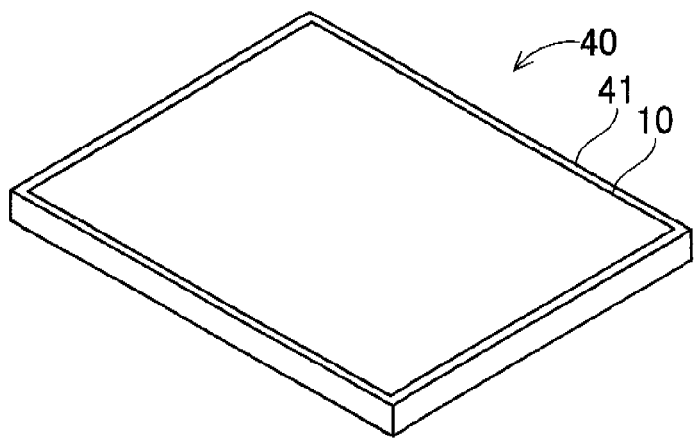
FIG. 14 A perspective view of an illuminating device according to the invention.

Although the above example deals with a case where the organic EL element is used as a backlight in a liquid crystal display device, this is not meant to limit its use in any way: for example, the organic EL element may be formed in a desired size for use as a high-luminance, long-life white-light illuminating device for indoor or outdoor use. In this case, as shown in FIG. 14, which is a perspective exterior view of the illuminating device, the organic EL element 10 in the desired size is fitted with a frame 41 to build the illuminating device 40, which can be used, for example, while installed on the ceiling in a room. In this case also, it is possible either to use, as the transparent substrate 11, one having at least one of birefringence—capable of changing the polarization direction of light—and light diffusivity, or to lay on the surface of the transparent substrate 11 facing the liquid crystal panel 21, i.e. the light exit surface of the transparent substrate 11, at least one of a birefringent sheet or a light-diffusive sheet as described above.

The organic EL element may be used as a backlight in any display device other than a liquid crystal display device; for example, it can be used as a backlight in a display device of the type that switches transmission and shielding of the transmitted light by mechanically moving a movable member formed of polymer electrolytic film as disclosed in JP-A-2003-200612.

Hereinafter, the present invention will be described in more detail by way of practical examples, which are however not meant to limit the invention in any way. In these practical examples, unless otherwise specified, "%" denotes "film thickness ratio (%)". The structures of the compounds used in the practical examples will also be shown below.

PRACTICAL EXAMPLE 1

Before the description of the organic EL elements of practical examples, the organic EL element for comparison will be described.

Figure 15:
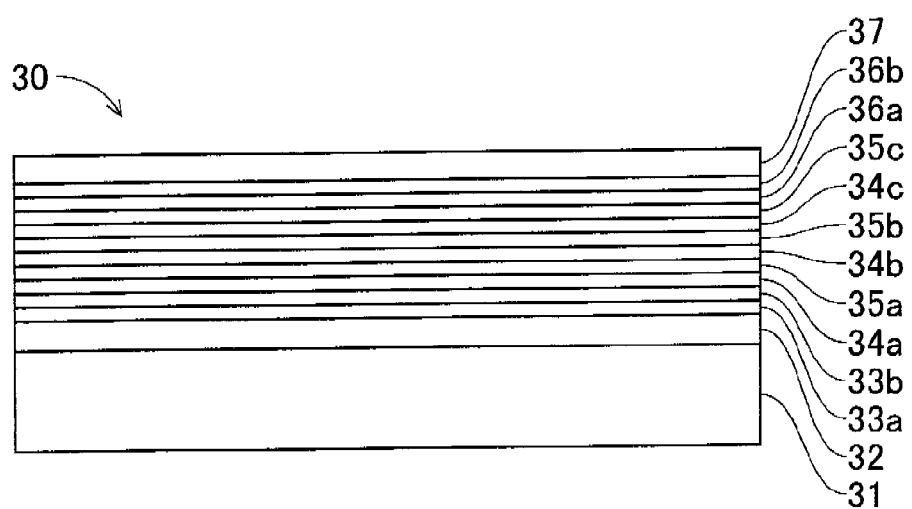
FIG. 15 An outline structure diagram of an organic EL element according to an embodiment.

As the organic EL element for comparison, an organic EL element 30 as shown in FIG. 15 is used. First, on a light-transmitting substrate 31 formed of a 30 mm wide, 30 mm long, and 0.7 mm thick glass substrate with a refractive index of 1.52, a transparent hole injection electrode 32 is formed that is formed of ITO (indium tin oxide) and 120 nm thick. The light-transmitting substrate 31 having the transparent hole injection electrode 32 formed on it is subjected to ultrasonic cleaning using isopropyl alcohol, is then dried in dry nitrogen gas, and is then subjected to UV ozone cleaning for five minutes.

The light-transmitting substrate 31 having undergone UV ozone cleaning is placed in a vacuum deposition machine, and, under a degree of vacuum of $4 \times 10^{-6}$ Pa, the following layers are formed on the transparent hole injection electrode 32 mentioned above: a 40 nm thick hole injection layer 33a formed of m-MTDATA; a 40 nm thick hole transport layer 33b formed of α-NPD; a 15 nm thick blue/cyan light-emitting layer 34a formed of 97% by weight of host compound A doped with 3% by weight of dopant A; a 5 nm thick first intermediate layer 35a formed of compound B; a 10 nm thick red light-emitting layer 34b formed of 92% by weight of CBP as a host compound doped with 8% by weight of dopant B; a 3 nm thick second intermediate layer 35b formed of CBP; a 3 nm green light-emitting layer 34c formed of 95% by weight of CBP as a host compound doped with 5% by weight of dopant C; a 10 nm thick third intermediate layer 35c formed of compound C; a 20 nm thick electron transport layer 36a formed of Alq3; and a 1 nm thick electron injection layer 36b formed of LiF. Then, on this electron injection layer 36b, a 110 nm thick electron injection electrode 37 of aluminum is formed; thus the organic EL element 30 is fabricated. Thereafter, in an atmosphere of nitrogen, the exposed part of the organic EL element 30 is coated with a glass case (unillustrated).

The materials and thicknesses of the layers mentioned above are listed in Table 4.

TABLE 4

| Layer Name | | Material | Thickness |
|---|---|---|---|
| Hole Injection Layer | | m-MTDATA | 40 nm |
| Hole Transport Layer | | α-NPD | 40 nm |
| Blue/Cyan | Dopant | (Dopant A) 3% | 15 nm |
| Light-Emitting Layer | Host | (Compound A) 97% | |
| 1st Intermediate Layer | | (Compound B) | 5 nm |
| Red | Dopant | (Dopant B) 8% | 10 nm |
| Light-Emitting Layer | Host | CBP 92% | |
| 2nd Intermediate Layer | | CBP | 3 nm |
| Green | Dopant | (Dopant C) 5% | 3 nm |
| Light-Emitting Layer | Host | CBP 95% | |
| 3rd Intermediate Layer | | (Compound B) | 10 nm |
| Electron Transport Layer | | Alq3 | 20 nm |
| Electron Injection Layer | | LiF | 1 nm |

Of the compounds listed in Table 4, the chemical formulae of m-MTDATA, α-NPD, compound A, dopant A, compound B, CBP, dopant B, dopant C, and Alq3 are shown in Chemical Formulae 1 to 9 below.

[Chemical Formula 1]

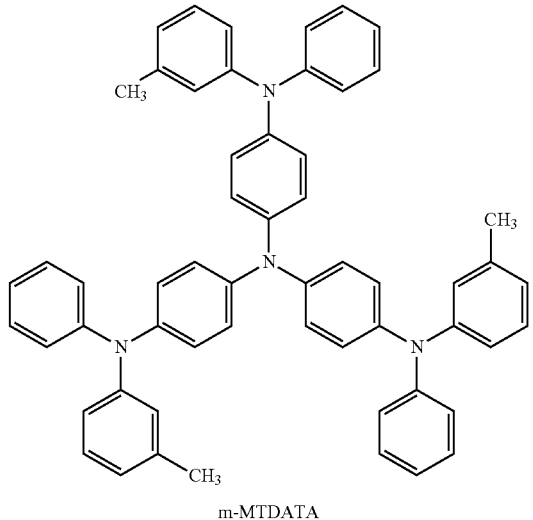

m-MTDATA

[Chemical Formula 2]

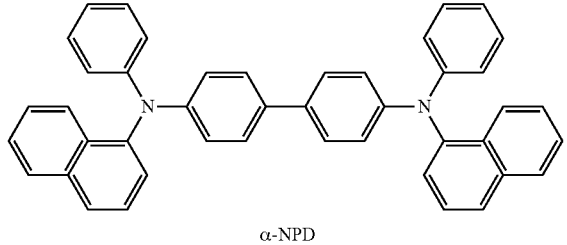

α-NPD

[Chemical Formula 3]

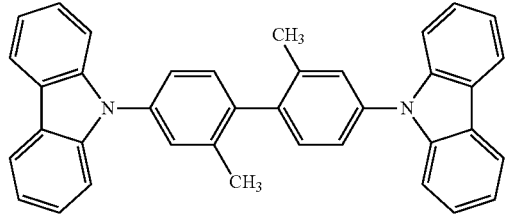

[Chemical Formula 4]

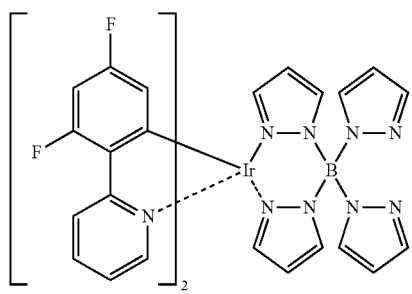

[Chemical Formula 9]

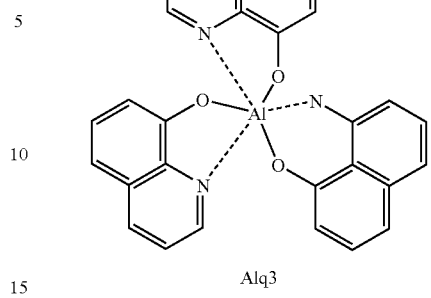

Alq3

[Chemical Formula 5]

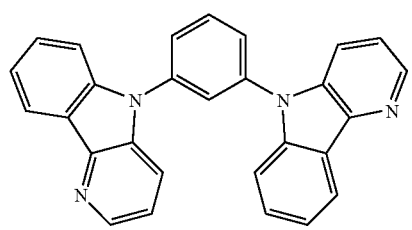

[Chemical Formula 6]

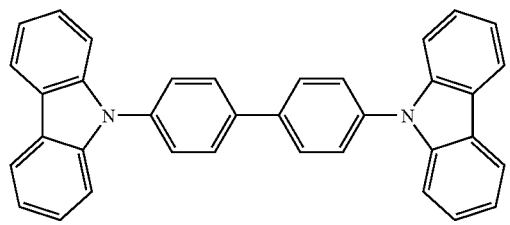

CBP

[Chemical Formula 7]

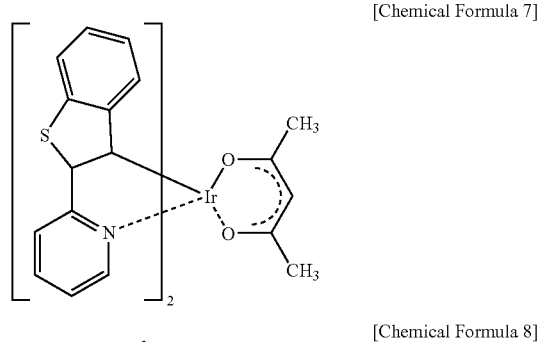

[Chemical Formula 8]

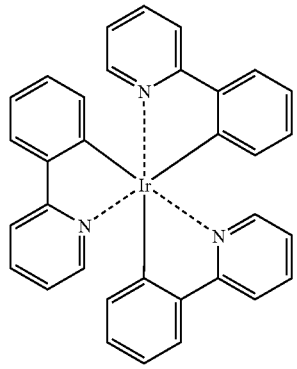

Figure 16:
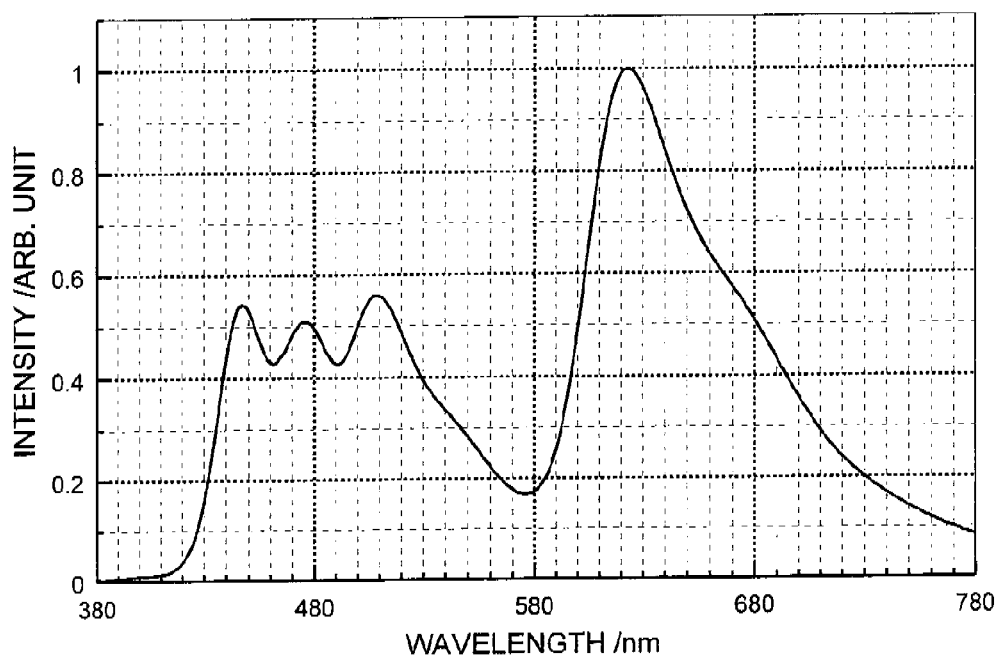
FIG. 16 The light emission spectrum of an organic EL element for comparison.

Through measurement of its spectral characteristics on a commercially available spectral radiometer, the organic EL element for comparison thus fabricated is found to produce a light emission spectrum as shown in FIG. 16.

Next, the organic EL element of Practical Example 1 will be described. Except that a diffraction grating is formed on the surface of the light-transmitting substrate 31 facing the transparent hole injection electrode 32, the organic EL element of Practical Example 1 has a structure similar to that of the organic EL element for comparison, i.e. similar to that of the organic EL element 30 shown in FIG. 15. The diffraction grating has an oblique lattice with lattice constants a=438 nm, b=379 nm, and c=313 nm as shown in FIG. 2, and has a 180 deep circular hole formed at each of the positions corresponding to the lattice points on the light-transmitting substrate 31.

Figure 17:
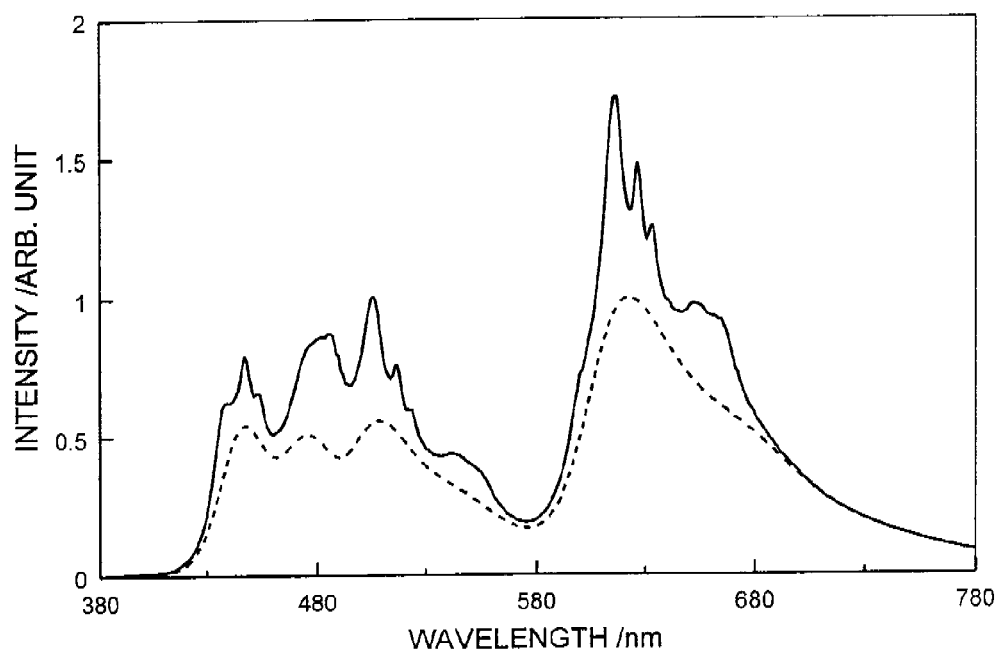
FIG. 17 The light emission spectra of the organic EL element of Example 1 and the organic EL element for comparison.

Through measurement, similar as with the organic EL element for comparison, of its spectral characteristics on a commercially available spectral radiometer, the organic EL element of Practical Example 1 thus fabricated is found to produce a light emission spectrum as shown in FIG. 17. In FIG. 17, the solid line represents the light emission spectrum of the element of Practical Example 1, and the broken line represents the light emission spectrum of the element for comparison. Moreover, measurement of the current-luminance characteristic reveals a 1.35 times increase in luminance.

PRACTICAL EXAMPLE 2

Next, the organic EL element of Practical Example 2 will be described. Except that the diffraction grating has a square lattice, the organic EL element of Practical Example 2 has a structure similar to that of the organic EL element of Practical Example 1. The diffraction grating has a square lattice with a grating constant of 772 nm, and has a 180 deep circular hole formed at each of the positions corresponding to the lattice points on the light-transmitting substrate 31.

Figure 18:
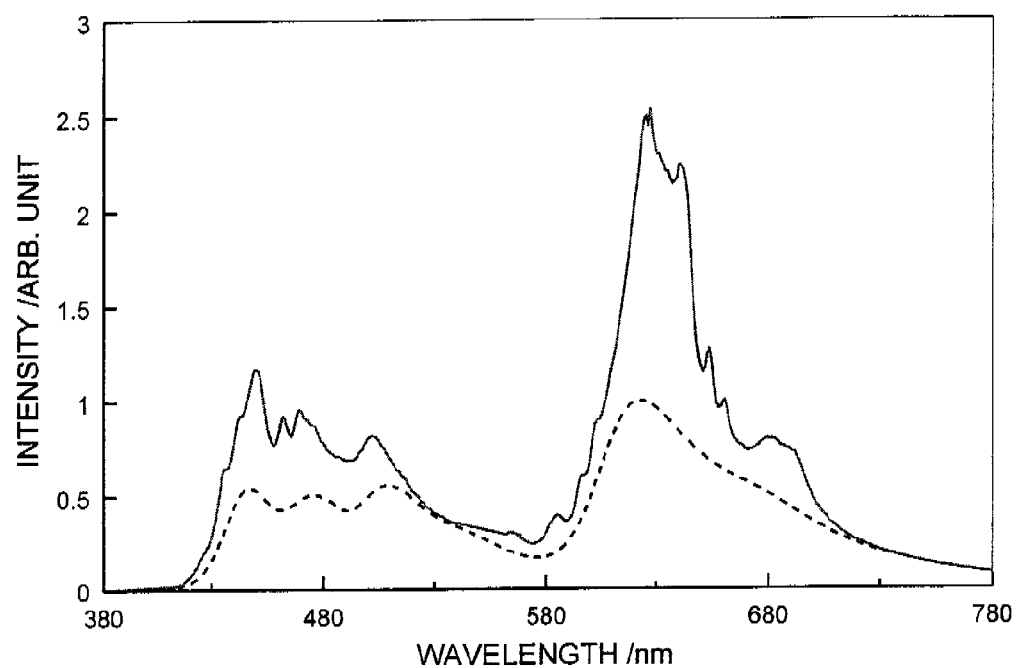
FIG. 18 The light emission spectra of the organic EL element of Example 2 and the organic EL element for comparison.

Through measurement, similar as with the organic EL element for comparison, of its spectral characteristics on a commercially available spectral radiometer, the organic EL element of Practical Example 2 thus fabricated is found to produce a light emission spectrum as shown in FIG. 18. In FIG. 18, the solid line represents the light emission spectrum of the element of Practical Example 1, and the broken line represents the light emission spectrum of the element for comparison. Moreover, measurement of the current-luminance characteristic reveals a 1.65 times increase in luminance.

PRACTICAL EXAMPLE 3

Next, the organic EL element of Practical Example 3 will be described. Except that the diffraction grating has a square lattice, the organic EL element of Practical Example 3 has a structure similar to that of the organic EL element of Practical Example 1. The diffraction grating has a square lattice with a grating constant of 842 nm, and has a 180 deep circular hole formed at each of the positions corresponding to the lattice points on the light-transmitting substrate 31.

Figure 19:
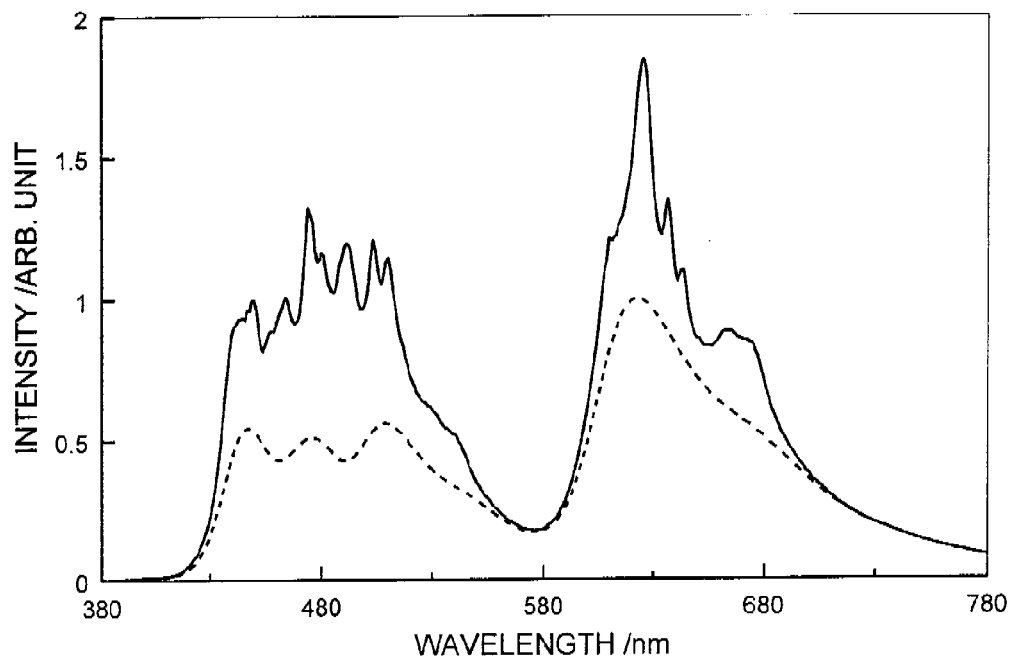
FIG. 19 The light emission spectra of the organic EL element of Example 3 and the organic EL element for comparison.
Figure 20:
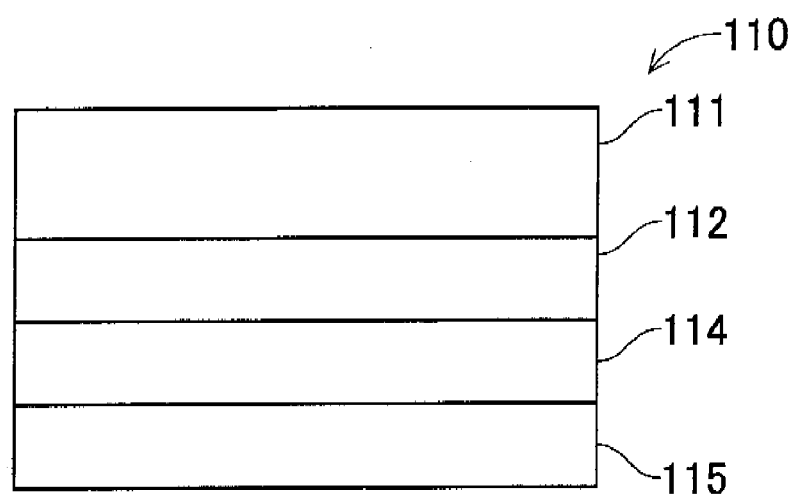
FIG. 20 An outline structure diagram of a conventional organic EL element.

Through measurement, similar as with the organic EL element for comparison, of its spectral characteristics on a commercially available spectral radiometer, the organic EL element of Practical Example 2 thus fabricated is found to produce a light emission spectrum as shown in FIG. 19. In FIG. 19, the solid line represents the light emission spectrum of the element of Practical Example 1, and the broken line represents the light emission spectrum of the element for comparison. Moreover, measurement of the current-luminance characteristic reveals a 1.52 times increase in luminance.

INDUSTRIAL APPLICABILITY

The present invention finds application in organic EL elements as white light sources in general.

The invention claimed is:

1. An organic electroluminescence element for emitting white light, comprising:
   a substrate;
   a first electrode formed on the substrate;
   a light-emitting layer formed on the first electrode for generating white light; and
   a second electrode formed on the light-emitting layer,
   wherein a refractive index distribution having two-dimensional translational symmetry is provided at one or more of the following locations:
      near the first electrode inside the substrate;
      at an interface between the substrate and the first electrode;
      at an interface between the first electrode and the light-emitting layer; and
      at an interface between the light-emitting layer and the second electrode,
   so that light of three or more wavelengths in a visible light region contained in white light generated in the light-emitting layer is diffracted by periodicity of the refractive index distribution and, wherein, when
   fundamental translational vectors of the refractive index distribution having two-dimensional translational symmetry are vector $p=(p_x,p_y)$ and vector $q=(q_x, q_y)$,
   a refractive index that the light generated in the light-emitting layer experiences in effective terms inside the substrate, the first electrode, the light-emitting layer, and the second electrode is n,
   arbitrary integers are represented by M and N, and
   values $\lambda$ are represented by the following formula $$\lambda = n \times |p_x q_y - p_y q_x| / \sqrt{\{(Mq_y - Np_y)^2 + (Np_x - Mq_x)^2\}},$$

for different sets of (M, N), one or more values $\lambda$ exist in a red wavelength region, and two or more values $\lambda$ exist in a green to blue wavelength region.

2. The organic electroluminescence element according to claim 1,
   wherein, of the white light generated in the light-emitting layer, light of three or more wavelengths in the visible light region incident on any of the interfaces at incidence angles larger than a critical angle is diffracted to outside.

3. The organic electroluminescence element according to claim 1,
   wherein the red wavelength region is 605 nm or more but 660 nm or less, and the green to blue wavelength region is 435 nm or more but 535 nm or less.

4. The organic electroluminescence element according to claim 1,
   wherein the refractive index is 1.6 or more but 1.9 or less.

5. The organic electroluminescence element according to claim 1,
   wherein the refractive index is 1.7 or more but 1.8 or less.

6. The organic electroluminescence element according to claim 1,
   wherein the integers M and N fulfill $|M| \leq 5$ and $|N| \leq 5$ simultaneously.

7. The organic electroluminescence element according to claim 1,
   wherein the two-dimensional translational symmetry of the refractive index distribution forms an oblique lattice, vectors p and q being different in magnitude and forming an angle other than 90°.

8. The organic electroluminescence element according to claim 1,
   wherein the two-dimensional translational symmetry of the refractive index distribution forms a square lattice with a grating constant r, the fundamental translational vectors being vector $p=(r,0)$ and vector $q=(0,r)$, the value $\lambda$ being given by $\lambda = n \times r / \sqrt{(M^2+N^2)}$.

9. The organic electroluminescence element according to claim 1,
   wherein the two-dimensional translational symmetry of the refractive index distribution forms a triangular lattice with a grating constant r, the fundamental translational vectors being vector $p=(r,0)$ and vector $q=(-r/2,\sqrt{3}\times r/2)$, the value $\lambda$ being given by $\lambda = n \times \sqrt{3} \times r / \{2+\sqrt{(M^2 MN+N^2)}\}$.

10. The organic electroluminescence element according to claim 1,
    wherein the two-dimensional translational symmetry of the refractive index distribution forms a simple rectangular lattice with grating constants r and 2, the fundamental translational vectors being vector $p=(r, 0)$ and vector $q=(0, s)$, the value $\lambda$ being given by $\lambda = n \times rs / \sqrt{\{M^2 s^2 + N^2 r^2\}}$.

11. The organic electroluminescence element according to claim 1,
    wherein the two-dimensional transational symmetry of the refacctive index distribution forms a face-centered rectangular lattice with grating constants r and 2, the fundamental translational vectors being vector $p=(r/2, s/2)$ and vector $q=(-r/2, s/2)$, the value $\lambda$ being given by $\lambda = n \times rs / \sqrt{\{(M-N)^2 s^2 + (M+N)^2 r^2\}}$.

12. An illuminating device comprising the organic electroluminescence element according to claim 1.

13. A display device comprising a liquid crystal panel and, as a backlight, the organic electroluminescence element according to claim 1.

14. The illuminating device according to claim 12, further comprising, on a light exit surface of the organic electroluminescence element, at least one of
    a birefringent sheet capable of changing polarization direction of light and
    a light-diffusive sheet.

15. The display device according to claim 13, further comprising, on a light exit surface of the organic electroluminescence element, at least one of
    a birefringent sheet capable of changing polarization direction of light and
    a light-diffusive sheet.

16. An organic electroluminescence element for emitting white light, comprising:
- a substrate;
- a first electrode formed on the substrate;
- a light-emitting layer formed on the first electrode for generating white light; and
- a second electrode formed on the light-emitting layer,
- wherein a refractive index distribution having two-dimensional translational symmetry is provided at one or more of the following locations:
- near the first electrode inside the substrate; and
- at an interface between layers between the substrate and the second electrode,
- so that light of three or more wavelengths in a visible light region contained in white light generated in the light-emitting layer is diffracted by periodicity of the refractive index distribution and, wherein, when
- fundamental translational vectors of the refractive index distribution having two-dimensional translational symmetry are vector $p=(p_x, p_y)$ and vector $q=(q_x, q_y)$,
- a refractive index that the light generated in the light-emitting layer experiences in effective terms inside the substrate, the first electrode, the light-emitting layer, and the second electrode is n,
- arbitrary integers are represented by M and N, and
- values λ are represented by the following formula $$\lambda = n \times |p_x q_y - p_y q_x| / \sqrt{\{(Mq_y - Np_y)^2 + (Np_x - Mq_x)^2\}},$$

for different sets of (M, N), one or more values λ exist in a red wavelength region, and two or more values λ exist in a green to blue wavelength region.

17. An organic electroluminescence element for emitting white light, comprising:
- a substrate;
- a first electrode formed on the substrate;
- a light-emitting layer formed on the first electrode for generating white light; and
- a second electrode formed on the light-emitting layer,
- wherein a refractive index distribution having two-dimensional translational symmetry is provided between the substrate and the second electrode,
- so that light of three or more wavelengths in a visible light region contained in white light generated in the light-emitting layer is diffracted by periodicity of the refractive index distribution and, wherein, when
- fundamental translational vectors of the refractive index distribution having two-dimensional translational symmetry are vector $p=(p_x, p_y)$ and vector $q=(q_x, q_y)$,
- a refractive index that the light generated in the light-emitting layer experiences in effective terms inside the substrate, the first electrode, the light-emitting layer, and the second electrode is n,
- arbitrary integers are represented by M and N, and
- values λ are represented by the following formula $$\lambda = n \times |p_x q_y - p_y q_x| / \sqrt{\{(Mq_y - Np_y)^2 + (Np_x - Mq_x)^2\}},$$

for different sets of (M, N), one or more values λ exist in a red wavelength region, and two or more values λ exist in a green to blue wavelength region.

* * * * *

UNITED STATES PATENT AND TRADEMARK OFFICE
CERTIFICATE OF CORRECTION

| | | |
|---|---|---|
| PATENT NO. | : 7,973,469 B2 | Page 1 of 1 |
| APPLICATION NO. | : 12/298043 | |
| DATED | : July 5, 2011 | |
| INVENTOR(S) | : Mitsuru Yokoyama | |

It is certified that error appears in the above-identified patent and that said Letters Patent is hereby corrected as shown below:

<u>Column 28</u>:
Line 46, claim 11, delete "refacctive" and insert -- refractive --.

Signed and Sealed this
Thirteenth Day of September, 2011

David J. Kappos
*Director of the United States Patent and Trademark Office*